United States Patent
Sun et al.

(10) Patent No.: US 12,143,131 B2
(45) Date of Patent: Nov. 12, 2024

(54) TUNING COMPONENT, ANTENNA APPARATUS, AND TERMINAL DEVICE

(71) Applicant: Honor Device Co., Ltd., Guangdong (CN)

(72) Inventors: Qiao Sun, Shenzhen (CN); Kun Li, Shenzhen (CN); Silei Huyan, Shenzhen (CN); Yi Wang, Shenzhen (CN); Jinglei Zhang, Shenzhen (CN); Yuzhan Li, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 376 days.

(21) Appl. No.: 17/431,906

(22) PCT Filed: Feb. 6, 2020

(86) PCT No.: PCT/CN2020/074399
§ 371 (c)(1),
(2) Date: Aug. 18, 2021

(87) PCT Pub. No.: WO2020/168920
PCT Pub. Date: Aug. 27, 2020

(65) Prior Publication Data
US 2022/0149871 A1    May 12, 2022

(30) Foreign Application Priority Data
Feb. 18, 2019   (CN) .......................... 201910120619.9

(51) Int. Cl.
*H04B 1/00* (2006.01)
*H01Q 9/42* (2006.01)

(52) U.S. Cl.
CPC ............... *H04B 1/006* (2013.01); *H01Q 9/42* (2013.01)

(58) Field of Classification Search
CPC .... H04B 1/006; H04B 1/0458; H04B 1/0067; H04B 1/18; H01Q 9/42; H01Q 23/00;
(Continued)

(56) References Cited

U.S. PATENT DOCUMENTS 8,441,964 B2 * 5/2013 Wu .......................... H01Q 21/08
  333/101
8,552,916 B2 * 10/2013 Hossain ............... H01Q 9/0421
  343/745
(Continued)

FOREIGN PATENT DOCUMENTS

CN    103337717 A  * 10/2013  ............. H01Q 1/242
CN    205179210 U    4/2016
(Continued)

*Primary Examiner* — Seokjin Kim
(74) *Attorney, Agent, or Firm* — Leydig, Voit & Mayer, Ltd.

(57) ABSTRACT

This application provides a tuning component, including: a plurality of pins, where the plurality of pins include a first pin, a second pin, a third pin, and a fourth pin; a reactance element, where the reactance element is connected between the first pin and the second pin; a switch assembly, disposed between the third pin and the fourth pin; a first internal branch, where one end of the first internal branch is connected to the third pin; and a second internal branch, where one end of the second internal branch is connected to the fourth pin, where the other end of the first internal branch is connected to the other end of the second internal branch to form an integrated end, and the integrated end is connected to the first pin. This application further provides an antenna apparatus and a terminal device, to help reduce headroom requirement of antenna.

18 Claims, 14 Drawing Sheets

(58) Field of Classification Search
CPC .... H01Q 1/242; H01Q 1/50; H03H 2007/386; H03H 7/38
See application file for complete search history.

(56) References Cited

U.S. PATENT DOCUMENTS

| | | | | |
|---|---|---|---|---|
| 2002/0105474 | A1 | 8/2002 | Kitamura et al. | |
| 2013/0106672 | A1* | 5/2013 | Tung | H01Q 5/335 343/860 |
| 2014/0148097 | A1* | 5/2014 | Kao | H04B 5/00 455/41.1 |
| 2014/0375523 | A1* | 12/2014 | Li | H01Q 1/242 343/861 |
| 2016/0036126 | A1* | 2/2016 | Hung | H01Q 5/335 29/601 |
| 2016/0191019 | A1* | 6/2016 | Reedy | H03H 7/0153 307/98 |
| 2017/0187111 | A1* | 6/2017 | Noh | H01Q 5/335 |
| 2018/0048051 | A1 | 2/2018 | Chang et al. | |
| 2020/0381828 | A1* | 12/2020 | Li | H01Q 7/00 |
| 2020/0395157 | A1* | 12/2020 | Bøjer | H01F 27/40 |
| 2021/0384626 | A1* | 12/2021 | Li | H01Q 9/42 |
| 2021/0409055 | A1* | 12/2021 | Ayranci | H03F 1/223 |

FOREIGN PATENT DOCUMENTS

| | | | |
|---|---|---|---|
| CN | 106935955 A | 7/2017 | |
| CN | 106953176 A | 7/2017 | |
| CN | 107317111 A | 11/2017 | |
| CN | 107317112 A | 11/2017 | |
| CN | 107834205 A | 3/2018 | |
| CN | 109167187 A | 1/2019 | |
| CN | 109346831 A | 2/2019 | |
| EP | 1160915 A2 | 12/2001 | |
| EP | 3651359 A1 * | 5/2020 | ............. H01Q 1/242 |
| WO | 2016127344 A1 | 8/2016 | |

* cited by examiner

TUNING COMPONENT, ANTENNA APPARATUS, AND TERMINAL DEVICE

This application is a national stage of International Application No. PCT/CN2020/074399, filed on Feb. 6, 2020, which claims priority to Chinese Patent Application No. 201910120619.9, filed on Feb. 18, 2019, the disclosures of which are incorporated herein by reference in their entireties.

TECHNICAL FIELD

This application relates to the field of electronic devices, and in particular, to a tuning component, an antenna apparatus, and a terminal device.

BACKGROUND

Due to market requirements in recent years, a large screen-to-body ratio, a multi-camera, ultra-thin thickness, and the like mainly become development trend of mobile phones. Therefore, space in which components can be disposed inside a terminal is becoming smaller. However, with development of communications technologies, antennas of mobile phones need to cover a plurality of frequency bands, and a single antenna is difficult to cover a plurality of frequency bands, so that more antennas need to be deployed. How to deploy more antennas in limited space becomes a major problem in terminal antenna design.

SUMMARY

This application provides a tuning component, an antenna apparatus, and a terminal device, to reduce a headroom requirement of an antenna.

According to a first aspect, a tuning component is provided, and includes:
- a plurality of pins, where the plurality of pins include a first pin, a second pin, a third pin, and a fourth pin;
- a reactance element, where the reactance element is connected between the first pin and the second pin;
- a switch assembly, disposed between the third pin and the fourth pin;
- a first internal branch, where one end of the first internal branch is connected to the third pin; and
- a second internal branch, where one end of the second internal branch is connected to the fourth pin, where the other end of the first internal branch is connected to the other end of the second internal branch to form an integrated end, and the integrated end is connected to the first pin.

The tuning component further includes:
- a signal controller, where the signal controller is configured to control the switch assembly to switch between an on state and an off state of the first internal branch, and/or the signal controller is configured to control the switch assembly to switch between an on state and an off state of the second internal branch.

According to the tuning component in an embodiment of this application, a combination of the reactance element and the switch assembly enables the tuning component to implement a plurality of circuit states, thereby implementing different tuning states, to simplify a tuning circuit.

With reference to the first aspect, in some implementations of the first aspect, the reactance element is a variable capacitor; and the signal controller is further configured to switch a capacitance value of the reactance element.

According to the tuning component in an embodiment of this application, the variable capacitor may implement different circuit states, and a combination of the variable capacitor and the switch assembly may implement more circuit states, thereby implementing different tuning states, to simplify a tuning circuit.

With reference to the first aspect, in some implementations of the first aspect, the capacitance value of the variable capacitor ranges from 0.7 pF to 2.7 pF.

According to the tuning component in an embodiment of this application, a capacitance value ranging from 0.7 pF to 2.7 pF may implement a plurality of common frequency bands.

With reference to the first aspect, in some implementations of the first aspect, the variable capacitor is configured to switch between at least eight different capacitance values.

According to the tuning component in an embodiment of this application, when the variable capacitor has eight different capacitance values, a size of the tuning component is not excessively large, and there are a relatively large quantity of tunable circuit states.

With reference to the first aspect, in some implementations of the first aspect, the reactance element is a variable inductor; and the signal controller is further configured to switch an inductance value of the reactance element.

According to the tuning component in an embodiment of this application, the variable inductor may implement different circuit states, and a combination of the variable inductor and the switch assembly may implement more circuit states, thereby implementing different tuning states, to simplify a tuning circuit.

With reference to the first aspect, in some implementations of the first aspect, the tuning component further includes a branch reactor, where the branch reactor is disposed on the first internal branch or the second internal branch.

According to the tuning component in an embodiment of this application, the branch reactor may be used to increase application scenarios of the tuning component.

With reference to the first aspect, in some implementations of the first aspect, the branch reactor is a variable capacitor; and the signal controller is further configured to switch a capacitance value of the reactance element.

According to the tuning component in an embodiment of this application, the variable capacitor may implement different circuit states, and a combination of the reactance element, the branch reactor, and the switch assembly may implement more circuit states, thereby implementing different tuning states, to simplify a tuning circuit.

With reference to the first aspect, in some implementations of the first aspect, the branch reactor is a variable inductor; and the signal controller is further configured to switch a capacitance value of the branch inductor.

According to the tuning component in an embodiment of this application, the variable inductor may implement different circuit states, and a combination of the reactance element, the branch reactor, and the switch assembly may implement more circuit states, thereby implementing different tuning states, to simplify a tuning circuit.

With reference to the first aspect, in some implementations of the first aspect, the on state and the off state of the first internal branch correspond to two frequency bands, or the on state and the off state of the second internal branch correspond to two frequency bands.

According to a second aspect, an antenna apparatus is provided, and includes:

a feeding point and a first antenna radiator; and a tuning circuit, where a first end of the tuning circuit is connected to the feeding point, and a second end of the tuning circuit is connected to one end of the first antenna radiator;

and the tuning circuit includes:

N tuning components according to any one of the first aspect or the possible implementations of the first aspect, where at least two of a first pin, a second pin, a third pin, and a fourth pin of each of the N tuning components are connected between the first end of the tuning circuit and the second end of the tuning circuit, where n is a positive integer greater than or equal to 1.

In the antenna apparatus in an embodiment of this application, a tuning component that can implement a plurality of circuit states is used, so that a size of the antenna apparatus is reduced, and a headroom requirement of the antenna is reduced.

With reference to the second aspect, in some implementations of the second aspect, the N tuning components include a first tuning component, and a second pin of the first tuning component is connected to a first pin, a third pin, or a fourth pin of the first tuning component; or a second pin of the first tuning component is connected to the first end of the tuning circuit or the second end of the tuning circuit.

According to the antenna apparatus in an embodiment of this application, tuning performance of the antenna apparatus can be improved by using the foregoing connection manner.

With reference to the second aspect, in some implementations of the second aspect, the tuning circuit further includes a third end.

The antenna apparatus further includes a second antenna radiator, connected to a third end of the tuning circuit, where M tuning components according to any one of the first aspect or the possible implementations of the first aspect are disposed on a connection path between the first end of the tuning circuit and the third end of the tuning circuit; and at least two of a first pin, a second pin, a third pin, and a fourth pin of each of the M tuning components are connected between the first end of the tuning circuit and the third end of the tuning circuit, where M is a positive integer greater than or equal to 1.

In the antenna apparatus in an embodiment of this application, a tuning component that can implement a plurality of circuit states is used, so that tuning of a plurality of antenna radiators can be implemented, which can adapt to a multi-antenna scenario.

With reference to the second aspect, in some implementations of the second aspect, the M tuning components include a second tuning component, and the second tuning component is connected between the first end of the tuning circuit and the second end of the tuning circuit.

With reference to the second aspect, in some implementations of the second aspect, the tuning components include a third tuning component, a third pin of the third tuning component is connected to the second end of the tuning circuit, and a fourth pin of the third tuning component is connected to the third end of the tuning circuit.

With reference to the second aspect, in some implementations of the second aspect, the first antenna radiator is a composite right/left handed+inverted-F antenna radiator. The antenna apparatus further includes an external capacitor, where the external capacitor is connected between the second end of the tuning circuit and the first antenna radiator.

In the antenna apparatus in an embodiment of this application, a tuning component that can implement a plurality of circuit states is used, so that tuning of the composite right/left handed+inverted-F antenna can be implemented.

With reference to the second aspect, in some implementations of the second aspect, the antenna apparatus further includes a ground point; and the N tuning components include a fourth tuning component, and at least one of a first pin, a second pin, a third pin, and a fourth pin of the fourth tuning component is connected to the ground point.

With reference to the second aspect, in some implementations of the second aspect, N is a positive integer greater than or equal to 2, and at least one of a first pin, a second pin, a third pin, and a fourth pin of any one of the N tuning components is connected to at least one of a first pin, a second pin, a third pin, and a fourth pin of one of tuning components other than the any tuning component in the N tuning components.

According to the antenna apparatus in an embodiment of this application, a plurality of tuning components are connected in series, so that multiplicative circuit states may be implemented, and a tunable frequency band bandwidth may be expanded.

With reference to the second aspect, in some implementations of the second aspect, the N tuning components include a fifth tuning component and a sixth tuning component, where at least one of a second pin, a third pin, and a fourth pin of the fifth tuning component is connected to a first pin of the sixth tuning component.

With reference to the second aspect, in some implementations of the second aspect, the tuning circuit further includes: a first external branch, where one end of the first external branch is connected to the third pin or the fourth pin of the fifth tuning component; and a second external branch, where one end of the second external branch is connected to the third pin or the fourth pin of the fifth tuning component, and the sixth tuning component is disposed on the first external branch.

With reference to the second aspect, in some implementations of the second aspect, the N tuning components further include a seventh tuning component, disposed on the second external branch.

According to the antenna apparatus in an embodiment of this application, a plurality of tuning components are connected in parallel, so that more circuit states may be implemented, and a tunable frequency band bandwidth is expanded.

With reference to the second aspect, in some implementations of the second aspect, the antenna apparatus further includes a single-pole multi-throw switch tuning component, disposed on the second external branch.

In the antenna apparatus in an embodiment of this application, the tuning component may be further connected to another component, to implement a tuning function of the antenna apparatus.

With reference to the second aspect, in some implementations of the second aspect, the first antenna radiator is a ring antenna radiator.

According to a third aspect, a terminal device is provided, where the terminal device includes the antenna apparatus according to any one of the second aspect or the possible implementations of the second aspect.

DESCRIPTION OF EMBODIMENTS

Figure 1:
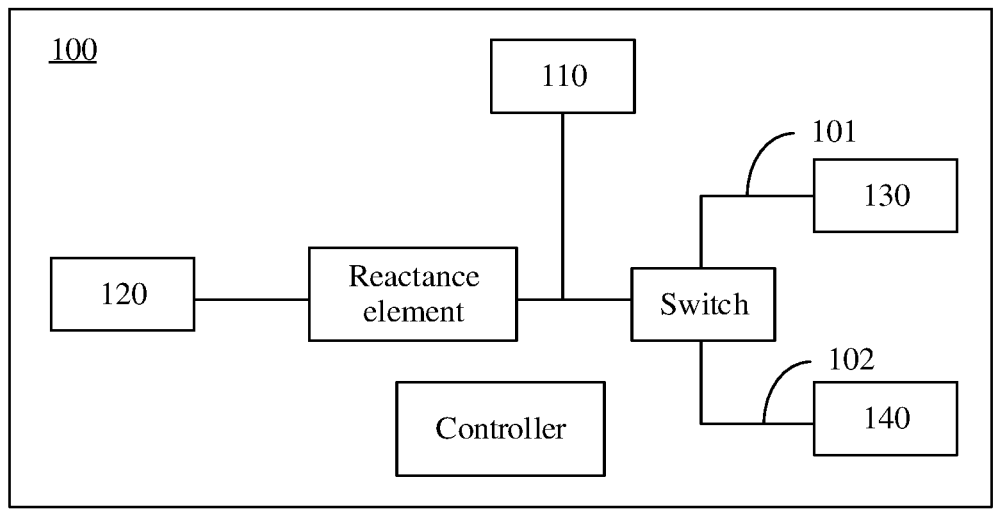
FIG. 1 is a schematic structural diagram of a tuning component according to an embodiment of this application.

The following describes technical solutions of this application with reference to accompanying drawings.

The terms used in the following embodiments are merely for the purpose of describing a particular embodiment, but are not intended to limit this application. The terms "one", "a", "the", "the foregoing", and "this" of singular forms used in this specification and the appended claims of this application are also intended to include plural forms, unless otherwise specified in the context clearly. It should be further understood that in an embodiment of this application, "one or more" refers to one, two, or more; and/or" describes the association relationship between associated objects, indicating that there may exist three relationships. For example, A and/or B may represent the following cases: Only A exists, both A and B exist, and only B exists, where A and B may be singular or plural. The character "/" usually indicates an "or" relationship between the associated objects.

Referring to "an embodiment", "some embodiments", or the like described in this specification means that particular features, structures, or characteristics described in combination with the embodiments are included in one or more embodiments of this application. Therefore, the statements "in one embodiment", "in some embodiments", "in some other embodiments", "in other embodiments", and the like appearing in differences in this specification do not necessarily refer to the same embodiments, but mean "one or more but not all embodiments", unless otherwise specially emphasized. The terms "including", "having", and variations thereof mean "including but not limited to", unless otherwise specifically emphasized.

A terminal device in the embodiments of this application may be user equipment, an access terminal, a subscriber unit, a subscriber station, a mobile station, a mobile console, a remote station, a remote terminal, a mobile device, a user terminal, a terminal, a wireless communications device, a user agent, or a user apparatus. The terminal device may alternatively be a cellular phone, a cordless phone, a session initiation protocol (Session Initiation Protocol, SIP) phone, a wireless local loop (Wireless Local Loop, WLL) station, a personal digital assistant (Personal Digital Assistant, PDA), a handheld device having a wireless communication function, a computing device, another processing device connected to a wireless modem, a vehicle-mounted device, a wearable device, a terminal device in a future 5G network, a terminal device in a future evolved public land mobile network (Public Land Mobile Network, PLMN), or the like. This is not limited in the embodiments of this application.

For ease of description, "connection" in this application represents a plurality of possible connection, assembly, and association manners, including electrical connection, that is, a connectable path exists between elements.

The following describes a specific implementation of the embodiments of this application in more detail with reference to specific examples. It should be noted that the following examples are merely intended to help a person skilled in the art understand the embodiments of this application, but are not intended to limit the embodiments of this application to specific values or specific scenarios in the examples. It is clear that a person skilled in the art can make various equivalent modifications or changes based on the examples described below, and such modifications and changes also fall within the scope of the embodiments of this application.

FIG. 1 is a schematic structural diagram of a tuning component according to an embodiment of this application. As shown in FIG. 1, the tuning component 100 includes a substrate. A switch assembly, a reactance element, a first pin 110, a second pin 120, a third pin 130, a fourth pin 140, and a signal controller are disposed on the substrate. An internal circuit is disposed on the substrate to connect the foregoing components. The reactance element is connected in series between the first pin 110 and the second pin 120. The tuning component 100 further includes a first internal branch 101 and a second internal branch 102. One end of the first internal branch 101 is connected to the third pin 130, and one end of the second internal branch 102 is connected to the fourth pin 140. The other end of the first internal branch is connected to the other end of the second internal branch to form an integrated end, and the integrated end is connected to the first pin. The switch assembly is connected in series between the third pin 130 and the fourth pin 140. By using the signal controller, the switch assembly is controlled to switch between an on state and an off state of the first internal branch 101 and/or of the second internal branch 102.

The following describes in detail connection relationships, structures, and functions of the various components, respectively.

A. Signal Controller

The signal controller may generate an operation control signal according to an instruction operation code and a time sequence signal, to complete control of obtaining and executing an instruction, for controlling the switch assembly to switch between an on state and an off state of the first internal branch 101 and/or of the second internal branch 102.

After generating the control signal, the signal controller sends, via an output port (not shown in the figures) thereof, the control signal to an input port of the switch assembly.

In an embodiment of this application, a method and a process in which a local oscillator 110 generates a local oscillator signal may be similar to that in the prior art. To avoid repetition, descriptions of the method and the process are omitted herein.

B. Switch Assembly

The switch assembly is configured to switch between the on state and the off state of the first internal branch 101 and/or of the second internal branch 102. The switch assembly includes at least one switch.

Optionally, the switch assembly may be a single-pole double-throw switch assembly, and three states may be switched, including: a state in which the first internal branch 101 is connected and the second internal branch 102 is disconnected, a state in which the first internal branch 101 is disconnected and the second internal branch 102 is connected, and a state in which both the first internal branch 101 and the second internal branch 102 are disconnected.

Optionally, the switch assembly may include a switch assembly 1 connected in series to the first internal branch 101 and a switch assembly 2 connected in series to the second internal branch 102. The switch assembly may switch four states, including: a state in which the first internal branch 101 is connected and the second internal branch 102 is disconnected, a state in which the first internal branch 101 is disconnected and the second internal branch 102 is connected, a state in which the first internal branch 101 and the second internal branch 102 are both disconnected, and a state in which the first internal branch 101 and the second internal branch 102 are both connected.

That is, the switch assembly switches between the on state and the off state of the two branches, so that a plurality of circuit connection states can be implemented.

C. Reactance Element

The reactance element may play a tuning role in the tuning component 100.

Optionally, the reactance element is a capacitor and/or an inductor. For example, the capacitor can adjust an impedance position of the antenna radiator on the Smith chart from the first or second quadrant to the third or fourth quadrant, and the inductor may play a role in adjusting an impedance position of the antenna radiator on the Smith chart from the third or fourth quadrant to the first or second quadrant. However, by connecting a plurality of capacitors and/or a plurality of inductors in a combination manner, it is possible to adjust an impedance position on the Smith chart in a wider frequency band.

Optionally, the reactance element is a variable capacitor. In other words, the reactance element is a capacitor element that can be adjusted to a plurality of capacitance values. That is, the variable capacitor can implement different circuit states. Further, different tuning states may be implemented. For example, the reactance element may be adjusted to two different capacitance values 1 and 2. In this case, the capacitance values 1 and 2 may respectively correspond to different tuning degrees, and therefore may correspond to different frequency band ranges.

Optionally, the signal controller is further configured to switch different capacitance values of the reactance element.

Optionally, the capacitance value of the variable capacitor ranges from 0.7 pF to 2.7 pF. Capacitance values in a range of 0.7 pF to 2.7 pF may enable frequency band tuning, for example, 700 MHz to 6 GHz.

Optionally, the variable capacitor is configured to switch between at least eight different capacitance values.

It should be noted that, when the quantity of capacitance values that can be switched by the variable capacitor is less than eight, a component size of the variable capacitor is relatively small, but a quantity of circuit states or tuning states that can be implemented is relatively small. When the quantity of capacitance values that can be switched by the variable capacitor is greater than eight, a component size of the variable capacitor is relatively large, and a size of the tuning component 100 is relatively large.

Further, a combination of the variable capacitor and the switch assembly may implement more circuit states. For example, the variable capacitor may switch eight different capacitance values, and the switch assembly may implement four different circuit connection states. In this case, the tuning component 100 may implement 8×4 circuit states.

Further, the eight different capacitance values of the variable capacitor are respectively 0.7, 1, 1.3, 1.65, 1.9, 2.2, 2.4, and 2.7. In other words, the eight different capacitance values are uniformly distributed in a range of 0.7 pF to 2.7 pF, which is conducive to uniform tuning in a relatively large frequency band range.

Optionally, the reactance element is a variable inductor. In other words, the reactance element may be adjusted to an inductance element of a plurality of inductance values. For example, the reactance element may be adjusted to two different inductance values 1 and 2. In this case, the inductance values 1 and 2 may respectively correspond to different tuning degrees, and therefore may correspond to different frequency band ranges.

Optionally, the signal controller is further configured to switch different inductance values of the reactance element.

D. Pins

The pins include a first pin 110, a second pin 120, a third pin 130, and a fourth pin 140, and are configured to connect to one end of the external circuit.

Optionally, the tuning component 100 further includes at least one of a user identification (User Identification, USID) pin, a ground (Ground, GND) pin, a serial data (Serial Data, SDATA) pin, a voltage input/output (Voltage Input/Output, VIO) pin, and a serial clock (Serial Clock, SCLK) pin.

The USID pin is configured to identify an identifier of a component controlled by a mobile industry processor interface (Mobile Industry Processor Interface, MIPI). That is, each component is assigned with a number, and a control signal is sent to a corresponding component according to a corresponding number. The GND pin is configured to ground the tuning component 100. The SDATA pin is a data interface of the component and is configured to input a control data. The VIO pin connects to a power supply of the component and is configured to input a power signal. The SCLK pin is configured to input a clock control signal.

Optionally, the tuning component 100 may further include:

E. Branch Reactor

The branch reactor is disposed on the first internal branch or the second internal branch.

Optionally, the branch reactor is an inductor and/or a capacitor.

In an example, the reactance element is a capacitor, and an inductor element is connected in series between the switch assembly and the third pin 130 and/or the fourth pin 140. For example, an inductor element 1 is serially connected to the first internal branch 101, and an inductor element 2 is serially connected to the second internal branch 102. That is, the tuning component 100 may implement a circuit in which the capacitor and the inductor are connected in series.

In an example, the reactance element is an inductor, and a capacitor element is connected in series between the switch assembly and the third pin 130 and/or the fourth pin 140. For example, a capacitor element 1 is serially connected to the first internal branch 101. That is, the tuning component 100 may implement a circuit in which the inductor and the capacitor are connected in series.

In an example, the reactance element is a capacitor, and an inductor element and a capacitor element are respectively connected in series between the switch assembly and the third pin 130 and the fourth pin 140. For example, the inductor element 1 is serially connected to the first internal branch 101, and the capacitor element 1 is serially connected to the second internal branch 102. That is, the tuning component 100 may implement a circuit in which the inductor and the capacitor are connected in series, or may further implement a circuit in which two capacitors are connected in series.

In an example, the reactance element is an inductor, and an inductor element and a capacitor element are respectively connected in series between the switch assembly and the third pin 130 and the fourth pin 140. For example, the inductor element 1 is serially connected to the first internal branch 101, and the capacitor element 1 is serially connected to the second internal branch 102. That is, the tuning component 100 may implement a circuit in which an inductor and a capacitor are connected in series, or may further implement a circuit in which two inductors are connected in series.

Optionally, the branch reactor includes a variable capacitor.

Optionally, the signal controller is configured to switch different capacitance values of the branch reactor.

Optionally, the branch reactor includes a variable inductor.

Optionally, the signal controller is configured to switch different inductance values of the branch reactor.

Further, the reactance element, the branch reactor, and the switch assembly are combined to implement more circuit states. For example, the reactance element is a variable capacitor, and may switch between at least eight different capacitance values. The switch assembly may implement four different circuit connection states, and the first internal connected branch 101 is connected in series with two variable capacitors that can implement two different capacitance values, such that the tuning component 100 may implement 8×(3+2) circuit states.

Optionally, the tuning component 100 may further include a driver (Driver), a voltage regulator (Voltage Regular), a chargepump (Chargepump), and an electro-static discharge (Electro-Static Discharge, ESD) element.

The driver may be a driver chip of the tuning component 100. The voltage regulator is configured to stabilize an input voltage signal, so that the voltage signal can meet a use requirement. The chargepump is configured to boost the input voltage signal, for example, boost the input voltage from 1 V to 3 V, to meet the use requirement. The ESD element acts as an electrostatic shield to protect the components from electrostatic damage.

Optionally, the tuning component 100 may further include a substrate that is configured to bear elements in the tuning component 100.

In this application, the tuning component 100 may be applied to an antenna apparatus, and a frequency band of an antenna radiator is adjusted in two manners.

Manner 1

Optionally, the reactance element and/or the branch reactor inside the tuning component 100 may be configured to adjust an impedance position of the antenna radiator on the Smith chart.

For example, when the capacitor is grounded and connected in parallel to a connection path between the feeding point and the antenna radiator, the impedance position of the antenna radiator on the Smith chart may be adjusted clockwise from the first quadrant or the second quadrant to the third quadrant or the fourth quadrant.

For another example, when the inductor is grounded and connected in parallel to the connection path between the feeding point and the antenna radiator, the impedance position of the antenna radiator on the Smith chart may be adjusted counterclockwise from the third quadrant or the fourth quadrant to the first quadrant or the second quadrant.

For another example, when the capacitor is connected in series to the connection path between the feeding point and the antenna radiator, the impedance position of the antenna radiator on the Smith chart may be adjusted counterclockwise from the first quadrant or the second quadrant to the third quadrant or the fourth quadrant.

For another example, when the inductor is connected in series to the connection path between the feeding point and the antenna radiator, the impedance position of the antenna radiator on the Smith chart may be adjusted clockwise from the third quadrant or the fourth quadrant to the first quadrant or the second quadrant.

Manner 2

Optionally, the switch assembly is configured to adjust a circuit state of a circuit in which the tuning component 100 is located, and adjust a frequency band of the antenna radiator.

Optionally, the on state and the off state of the first internal branch correspond to two frequency bands, or the on state and the off state of the second internal branch correspond to two frequency bands.

In an example, a state in which the first internal branch 101 is connected and the second internal branch 102 is disconnected corresponds to a frequency band 1. A state in which the first internal branch 101 is disconnected and the second internal branch 102 is connected corresponds to a frequency band 2. A state in which both the first internal branch 101 and the second internal branch 102 are disconnected corresponds to a frequency band 3. A state in which both the first internal branch 101 and the second internal branch 102 are connected corresponds to a frequency band 4.

Optionally, the tuning component further includes a ground point, and the ground point is connected to one of the first pin 110, the second pin 120, the third pin 130, and the fourth pin 140.

Figure 2:
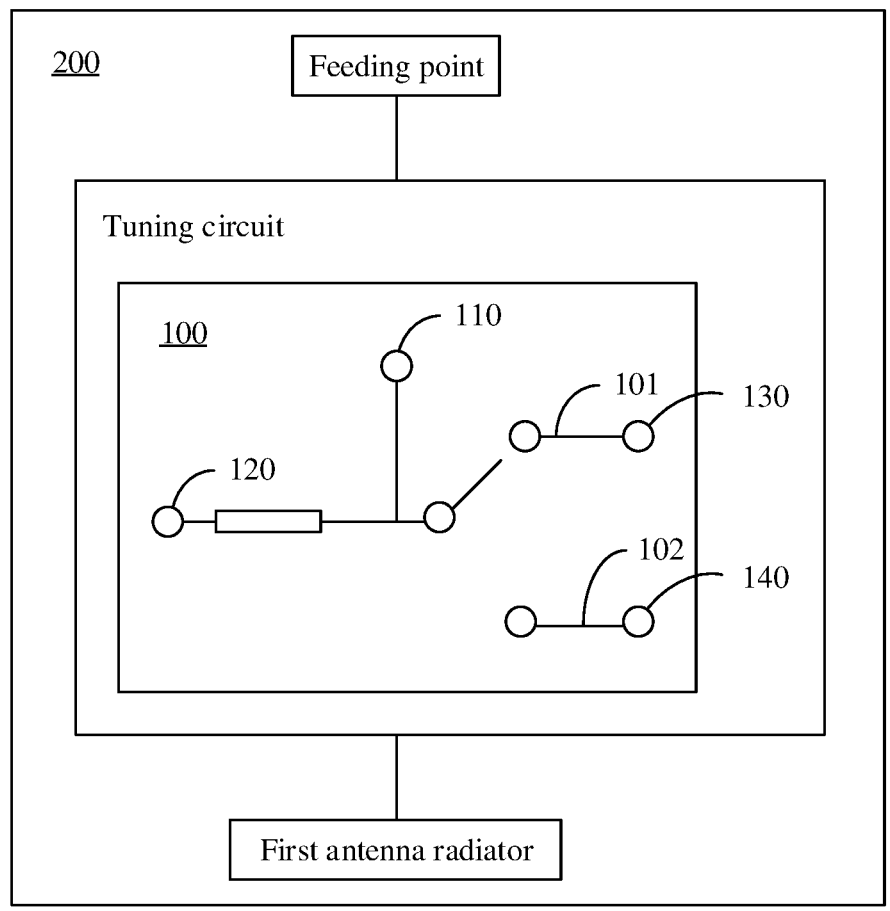
FIG. 2 is a schematic structural diagram of an antenna apparatus according to an embodiment of this application.

FIG. 2 is a schematic structural diagram of an antenna apparatus according to an embodiment of this application. The antenna apparatus 200 includes a first antenna radiator, a feeding point, and a tuning circuit, where the tuning circuit is configured to be connected between the first antenna radiator and the feeding point, a first end of the tuning circuit is connected to the feeding point, and a second end of the tuning circuit is connected to one end of the first antenna radiator. The tuning circuit includes N tuning components 100 shown in FIG. 1. At least two of the first pin 110, the second pin 120, the third pin 130, and the fourth pin 140 of each of the N tuning components 100 are configured to be connected between the first antenna radiator and the feeding point, where N is a positive integer greater than or equal to 1.

The following describes in detail connection relationships, structures, and functions of the various components, respectively.

F. First Antenna Radiator

The first antenna radiator is configured to receive a signal, or is configured to receive or send a signal.

G. Feeding Point

The feeding point is configured to provide a feed source for the first antenna radiator.

H. Tuning Component 100

The tuning component 100 is any possible form of the tuning component 100 shown in FIG. 1. The antenna apparatus 200 includes one or more tuning components 100.

The pins of the tuning component 100 connected between the first antenna radiator and the feeding point may be any at least two of the first pin 110, the second pin 120, the third pin 130, and the fourth pin 140. Each tuning component 100 is connected to the tuning circuit by using at least two of the first pin 110, the second pin 120, the third pin 130, and the fourth pin 140 of the tuning component 100.

In an example, at least two of the first pin 110, the second pin 120, the third pin 130, and the fourth pin 140 are configured to be connected between the first antenna radiator and the feeding point, or it may be two pins that are connected between the first antenna radiator and the feeding point. For example, the first pin 110 is connected to the feeding point, and the second pin 120 is connected to one end of the first antenna radiator. A reactance assembly inside the tuning component 100 is connected in series to a connection path between the feeding point and the first antenna radiator, to play a tuning role. The third pin 130 and/or the fourth pin 140 are/is connected to an external inductor element and grounded.

In an example, at least two of the first pin 110, the second pin 120, the third pin 130, and the fourth pin 140 are configured to be connected between the first antenna radiator and the feeding point, or it may be three pins that are connected between the first antenna radiator and the feeding point. For example, the first pin 110 is connected to the feeding point, the third pin 130 and the fourth pin 140 are both connected to one end of the first antenna radiator, and the second pin 120 is grounded.

In an example, at least two of the first pin 110, the second pin 120, the third pin 130, and the fourth pin 140 are configured to be connected between the first antenna radiator and the feeding point, or it may be four pins that are connected between the first antenna radiator and the feeding point. For example, both the first pin 110 and the second pin 120 are connected to the feeding point, and both the third pin 130 and the fourth pin 140 are connected to one end of the first antenna radiator.

Optionally, the N tuning components 100 include a first tuning component, and a second pin of the first tuning component is connected to a first pin, a third pin, or a fourth pin of the first tuning component; or a second pin of the first tuning component is connected to the first end of the tuning circuit or the second end of the tuning circuit.

In other words, a connection path exists at two ends of the reactance element inside the first tuning component.

In an example, the first pin of the first tuning component is connected to the feeding point, and the second pin is connected to the first pin, such that the second pin is connected to the feeding point. The third pin and/or the fourth pin are/is connected to one end of the first antenna radiator.

In an example, N is a positive integer greater than or equal to 2, and the tuning circuit includes a tuning component 1 and a tuning component 2, where a first pin of the tuning component 1 is connected to a feeding point, a third pin and/or a fourth pin of the tuning component 1 are/is connected to a first pin of the tuning component 2, and a third pin and/or a fourth pin of the tuning component 2 are/is connected to one end of the first antenna radiator. The tuning component 2 is the first tuning component, and a second pin of the tuning component 2 is connected to the first pin of the tuning component 1, that is, the tuning component 2 is connected to the feeding point.

In an example, the first pin of the first tuning component is connected to one end of the first antenna radiator, and the second pin is connected to the first pin. In this case, the second pin is connected to one end of the first antenna radiator. The third pin and/or the fourth pin are/is connected to the feeding point.

In an example, N is a positive integer greater than or equal to 2, and the tuning circuit includes a tuning component 1 and a tuning component 2, where a first pin of the tuning component 1 is connected to one end of the first antenna radiator, a third pin and/or a fourth pin of the tuning component 1 are/is connected to a first pin of the tuning component 2, and a third pin and/or a fourth pin of the tuning component 2 are/is connected to the feeding point. The tuning component 2 is the first tuning component, a second pin of the tuning component 2 is connected to the first pin of the tuning component 1, and the tuning component 2 is connected to one end of the first antenna radiator.

Optionally, the antenna apparatus 200 further includes a ground point. The N tuning components 100 include a fourth tuning component, and at least one of a first pin, a second pin, a third pin, and a fourth pin of the fourth tuning component is connected to the ground point.

In other words, the N tuning components 100 include a fourth tuning component, a pin of which is grounded, and the grounded pin may be one or more of a first pin, a second pin, a third pin, and a fourth pin of the fourth tuning component. For example, the N tuning components 100 include a fourth tuning component. A first pin of the fourth tuning component is connected to the feeding point, a second pin is connected to the ground point, and a third pin and/or fourth pin are/is connected to one end of the first antenna radiator.

Optionally, N is a positive integer greater than or equal to 2, and at least one of a first pin, a second pin, a third pin, and a fourth pin of any one of the N tuning components 100 is connected to at least one of a first pin, a second pin, a third pin, and a fourth pin of one of tuning components other than the any tuning component in the N tuning components 100.

In other words, the tuning circuit includes a plurality of tuning components 100 shown in FIG. 1, and each tuning component 100 is connected by using a first pin, a second pin, a third pin, and/or a fourth pin of the tuning component 100. That is, the plurality of tuning components are connected in series between the first antenna radiator and the feeding point. For example, the first pin of the tuning component 1 is connected to the second pin of the tuning component 2, the third pin of the tuning component 1 is connected to the feeding point, and the first pin of the tuning component 2 is connected to one end of the first antenna radiator. There are also many similar connection manners, and details are not described herein again.

Optionally, the N tuning components 100 include a fifth tuning component and a sixth tuning component, where at least one of a second pin, a third pin, and a fourth pin of the fifth tuning component is connected to a first pin of the sixth tuning component.

In other words, serial connection between the fifth tuning component and the sixth tuning component is implemented by connecting the first pin of the sixth tuning component and at least one of the second pin, the third pin, and the fourth pin of the fifth tuning component.

In an example, the first pin of the fifth tuning component is connected to the feeding point, the second pin of the fifth tuning component is connected to the first pin of the sixth tuning component, and the third pin and/or the fourth pin of the sixth tuning component are/is connected to one end of the first antenna radiator.

In an example, the first pin of the fifth tuning component is connected to the feeding point, the third pin of the fifth tuning component is connected to the first pin of the sixth tuning component, and the third pin and/or the fourth pin of the sixth tuning component are/is connected to one end of the first antenna radiator.

In an example, the first pin of the fifth tuning component is connected to one end of the first antenna radiator, the fourth pin of the fifth tuning component is connected to the first pin of the sixth tuning component, and the third pin and/or the fourth pin of the sixth tuning component are/is connected to the feeding point.

There are many similar connection manners, and details are not described herein again.

Optionally, the tuning circuit further includes:
 a first external branch, where one end of the first external branch is connected to the third pin or the fourth pin of the fifth tuning component; and
 a second external branch, where one end of the second external branch is connected to the third pin or the fourth pin of the fifth tuning component; and
 the sixth tuning component is disposed on the first external branch.

That is, two external branches led out from the third pin and/or the fourth pin of the fifth tuning component are the first external branch and the second external branch respectively, and the sixth tuning component is connected in series to one of the external branches, namely, the first external branch.

Optionally, at least one of the first pin, the second pin, the third pin, and the fourth pin of the fifth tuning component is connected to at least one of the first pin, the second pin, the third pin, and the fourth pin of the sixth tuning component.

Optionally, the N tuning components 100 further include a seventh tuning component, disposed on the second external branch.

That is, in the two external branches led from the fifth tuning component, one external branch is connected in series to the sixth tuning component, and the other external branch is connected in series to the seventh tuning component. The feeding point may be connected to one end of the first antenna radiator by using the fifth tuning component and the sixth tuning component, or may be connected to one end of the first antenna radiator by using the fifth tuning component and the seventh tuning component. That is, the sixth tuning component and the seventh tuning component are connected in parallel.

Optionally, at least one of the first pin, the second pin, the third pin, and the fourth pin of the fifth tuning component is connected to at least one of the first pin, the second pin, the third pin, and the fourth pin of the seventh tuning component.

Optionally, the antenna apparatus 200 further includes a single-pole multi-throw switch tuning component, disposed on the second external branch.

The single-pole multi-throw switch tuning component includes a single-pole multi-throw switch assembly, a ground point, and a plurality of reactance elements. At least one reactance element of the plurality of reactance elements is connected to the ground point. The single-pole multi-throw switch assembly includes one fixed end and a plurality of movable ends. One end of the plurality of reactance elements is connected to the plurality of movable ends of the single-pole multi-throw switch assembly. The single-pole multi-throw switch assembly is configured to switch between the plurality of reactance elements. For example, the single-pole multi-throw switch tuning component includes a single-pole double-throw switch assembly, a ground point, a first reactance element, and a second reactance element. The single-pole double-throw switch assembly includes a fixed end, a first movable end, and a second movable end. One end of the first reactance element is connected to the first movable end. One end of the second reactance element is connected to the fixed end, and the other end of the second reactance element is connected to the second movable end. The other end of the first reactance element is connected to the ground point.

That is, in the two external branches led from the fifth tuning component, one external branch is connected in series to the sixth tuning component, and the other external branch is connected in series to the single-pole multi-throw switch tuning component. The feeding point may be connected to one end of the first antenna radiator by using the fifth tuning component and the sixth tuning component, or may be connected to one end of the first antenna radiator by using the fifth tuning component and the single-pole multi-throw switch tuning component. That is, the sixth tuning component and the single-pole multi-throw switch tuning component are connected in parallel.

Optionally, the first antenna radiator is a ring antenna radiator.

Optionally, the antenna apparatus 200 further includes a package substrate that is configured to bear elements in the antenna apparatus 200.

Embodiment 1

Figure 3:
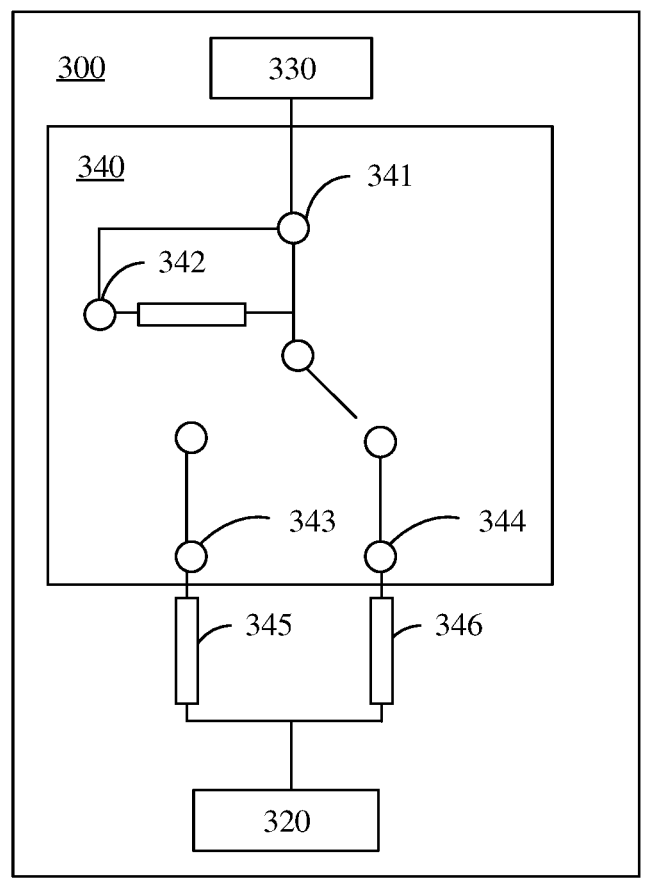
FIG. 3 is an internal circuit diagram of an antenna apparatus according to an embodiment of this application.

As shown in FIG. 3, the antenna apparatus 300 includes a first antenna radiator 320, a feeding point 330, and a tuning circuit. The tuning circuit is configured to be connected between the first antenna radiator 320 and the feeding point 330.

The tuning circuit includes one tuning component 340 shown in FIG. 1. A first pin 341 of the tuning component 340 is connected to the feeding point 330, and a third pin 343 and a fourth pin 344 of the tuning component 340 are connected to one end of the first antenna radiator 320. A reactance element 345 is connected in series between the third pin 343 and the first antenna radiator 320, and a reactance element 346 is connected in series between the fourth pin 344 and the first antenna radiator 320.

A switch assembly inside the tuning component 340 may switch a state of a circuit connected between the feeding point 330 and the first antenna radiator 320. For example, the switch assembly may perform switching such that the feeding point 330 is connected to one end of the first antenna radiator 320 by using a connection path between the first pin 341 and the third pin 343, while a connection path between the first pin 341 and the fourth pin 344 is disconnected. In this case, the reactance element 345 plays a tuning role. The switch assembly may further perform switching such that the feeding point 330 is connected to one end of the first antenna radiator 320 by using a connection path between the first pin 341 and the fourth pin 344, while a connection path between the first pin 341 and the third pin 343 is disconnected. In this case, the reactance element 346 plays a tuning role. The switch assembly may further perform switching such that the feeding point 330 is connected to one end of the first antenna radiator 320 by using a connection path between the first pin 341 and the third pin 343, and the feeding point 330 is connected to one end of the first antenna radiator 320 by using a connection path between the first pin 341 and the fourth pin 344. In this case, both the reactance element 345 and the reactance element 346 play a tuning role.

The second pin 342 of the tuning component 340 may be grounded. The second pin 342 of the tuning component 340 may be further connected to the first pin 341, the third pin 343, and the fourth pin 344 of the tuning component 340. FIG. 3 is a schematic diagram in which the second pin 342 of the tuning component 340 is connected to the first pin 341 of the tuning component 340.

Embodiment 2

Figure 4:
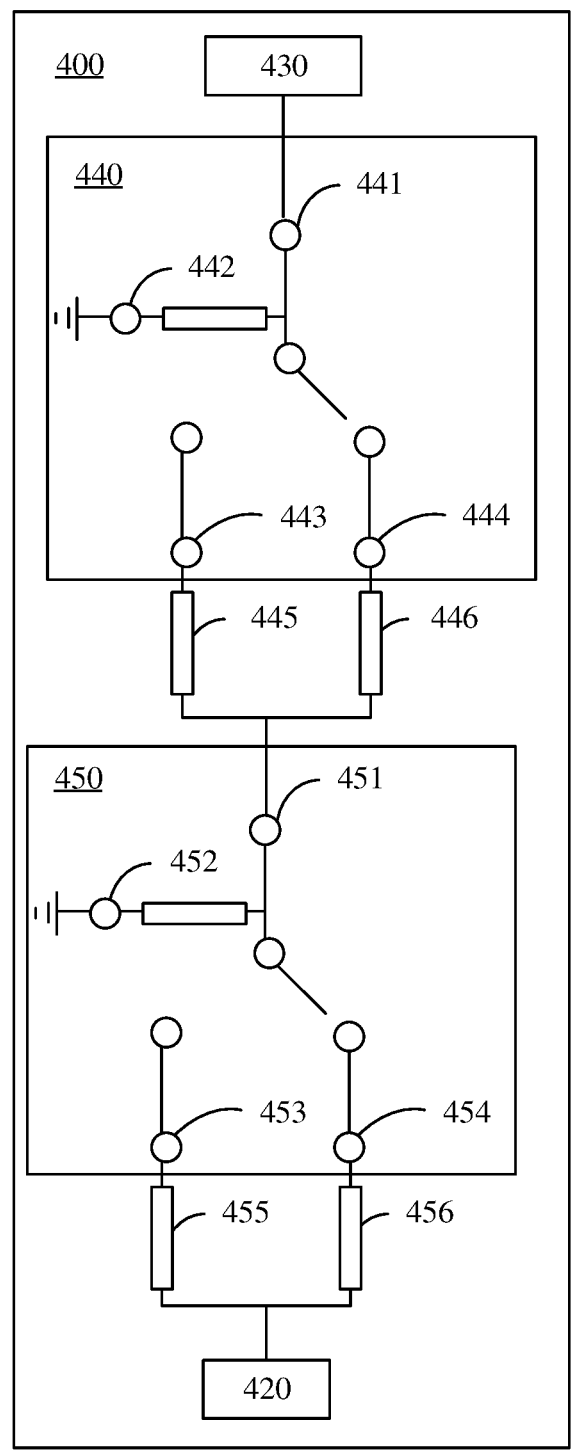
FIG. 4 is an internal circuit diagram of an antenna apparatus according to an embodiment of this application.

As shown in FIG. 4, the antenna apparatus 400 includes a package substrate, where a first antenna radiator 420, a feeding point 430, and a tuning circuit are disposed. The tuning circuit is configured to be connected between the first antenna radiator 420 and the feeding point 430.

The tuning circuit includes a tuning component 440 and a tuning component 450 shown in FIG. 1, where a first pin 441 of the tuning component 440 is connected to the feeding point 430, a third pin 443 and a fourth pin 444 of the tuning component 440 are connected to a first pin 451 of the tuning component 450, and a third pin 453 and a fourth pin 454 of the tuning component 450 are connected to one end of the first antenna radiator 420. A reactance element 445 is connected in series between the third pin 443 of the tuning component 440 and the first pin 451 of the tuning component 450, and a reactance element 446 is connected in series between the fourth pin 444 of the tuning component 440 and the first pin 451 of the tuning component 450. A reactance element 455 is connected in series between the third pin 453 of the tuning component 450 and the first antenna radiator 420, and a reactance element 456 is connected in series between the fourth pin 454 of the tuning component 450 and the first antenna radiator 420.

Both the tuning component 440 and the switch assembly inside the tuning component 450 may switch a state of a circuit connected between the feeding point 430 and the first antenna radiator 420. For example, the switch assembly inside the tuning component 440 may perform switching such that the feeding point 430 is connected to the first antenna radiator 420 by using a connection path between the first pin 441 and the third pin 443 of the tuning component 440, while a connection path between the first pin 441 and the fourth pin 444 of the tuning component 440 is disconnected. In this case, the reactance element 445 plays a tuning role. The switch assembly inside the tuning component 450 may further perform switching such that the feeding point 430 is connected to one end of the first antenna radiator 420 by using a connection path between the first pin 451 and the fourth pin 454 of the tuning component 450, while a connection path between the first pin 451 and the third pin 453 of the tuning component 450 is disconnected. In this case, the reactance element 456 plays a tuning role.

The second pin 442 of the tuning component 440 may be grounded. The second pin 442 of the tuning component 440 may be further connected to the first pin 441, the third pin 443, and the fourth pin 444 of the tuning component 440. Similarly, a second pin 452 of the tuning component 450 may be grounded. The second pin 452 of the tuning component 450 may be further connected to the first pin 451, the third pin 453, and the fourth pin 454 of the tuning component 450. FIG. 4 is a schematic diagram in which the second pin 442 of the tuning component 440 is grounded and the second pin 452 of the tuning component 450 is grounded.

The reactance element of the tuning component 440 may implement 8 different capacitance values, and the switch assembly of the tuning component 440 may implement at least 3 states, such that the tuning component 440 may implement at least 24 circuit states. Similarly, the reactance element of the tuning component 450 may implement 8 different capacitance values, and the switch assembly of the tuning component 450 may implement at least 3 states, such that the tuning component 450 may implement at least 24 circuit states. In this case, the tuning circuit may implement at least 24×24 circuit states. More circuit states can implement more frequency bands.

Embodiment 3

Figure 5:
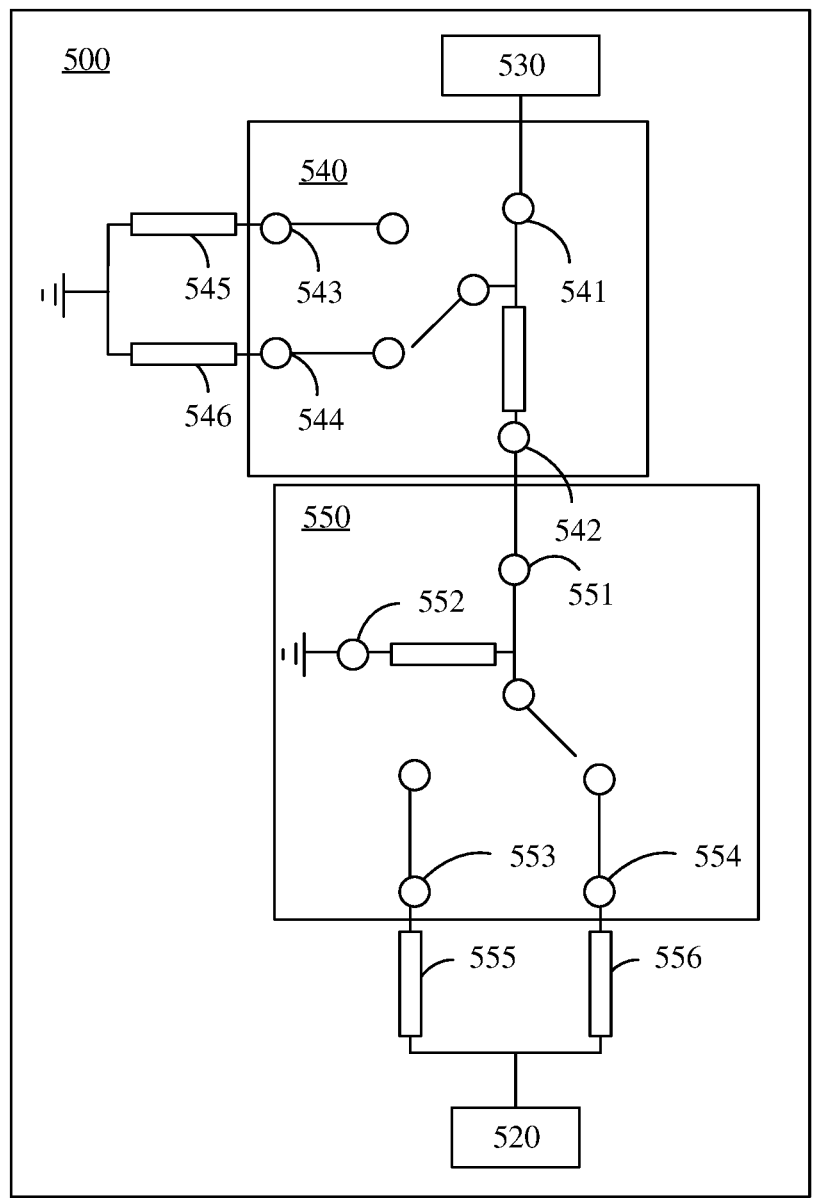
FIG. 5 is an internal circuit diagram of an antenna apparatus according to an embodiment of this application.

As shown in FIG. 5, the antenna apparatus 500 includes a package substrate, where a first antenna radiator 520, a feeding point 530, and a tuning circuit are disposed. The tuning circuit is configured to be connected between the first antenna radiator 520 and the feeding point 530.

The tuning circuit includes a tuning component 540 and a tuning component 550 shown in FIG. 1, where a first pin 541 of the tuning component 540 is connected to the feeding point 530, a second pin 542 of the tuning component 540 is connected to a first pin 551 of the tuning component 550, and a third pin 553 and a fourth pin 554 of the tuning component 550 are connected to one end of the first antenna radiator 520. A reactance element 545 is connected in series between the third pin 543 of the tuning component 540 and the ground point, and a reactance element 546 is connected in series between the fourth pin 544 of the tuning component 540 and the ground point. A reactance element 555 is connected in series between the third pin 553 of the tuning component 550 and the first antenna radiator 520, and a reactance element 556 is connected in series between the fourth pin 554 of the tuning component 550 and the first antenna radiator 520.

Both the tuning component 540 and the switch assembly inside the tuning component 550 may switch a state of a circuit connected between the feeding point 530 and the first antenna radiator 520. For example, the switch assembly inside the tuning component 540 may perform switching such that the first pin 541 is grounded by using a connection path between the first pin 541 and the third pin 543, while a connection path between the first pin 541 and the fourth pin 544 of the tuning component 540 is disconnected. In this case, the reactance element 545 plays a tuning role. The switch assembly inside the tuning component 550 may perform switching such that the feeding point 530 is connected to one end of the first antenna radiator 520 by using a connection path between the first pin 551 and the fourth pin 554 of the tuning component 550, while a connection path between the first pin 551 and the third pin 553 of the tuning component 550 is disconnected. In this case, the reactance element 556 plays a tuning role.

The second pin 552 of the tuning component 550 may be grounded. The second pin 552 of the tuning component 550 may be further connected to the first pin 551, the third pin 553, and the fourth pin 554 of the tuning component 550. FIG. 5 shows a schematic diagram in which the second pin 552 of the tuning component 550 is grounded.

The reactance element of the tuning component 540 may implement 8 different capacitance values, and the switch assembly of the tuning component 540 may implement at least 3 states, such that the tuning component 540 may implement at least 24 circuit states. Similarly, the reactance element of the tuning component 550 may implement 8 different capacitance values, and the switch assembly of the tuning component 550 may implement at least 3 states, such that the tuning component 550 may implement at least 24 circuit states. In this case, the tuning circuit may implement at least 24×24 circuit states. More circuit states can implement more frequency bands.

Embodiment 4

Figure 6:
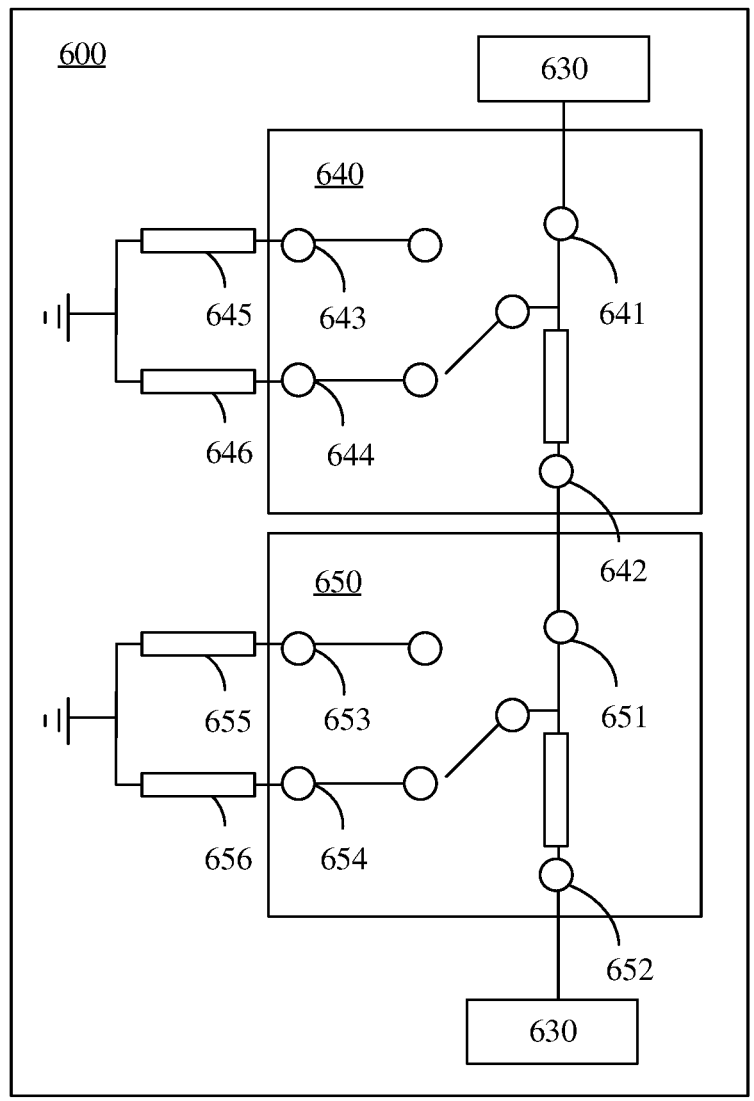
FIG. 6 is an internal circuit diagram of an antenna apparatus according to an embodiment of this application.

As shown in FIG. 6, the antenna apparatus 600 includes a package substrate, where a first antenna radiator 620, a feeding point 630, and a tuning circuit are disposed. The tuning circuit is configured to be connected between the first antenna radiator 620 and the feeding point 630.

The tuning circuit includes a tuning component 640 and a tuning component 650 shown in FIG. 1, where a first pin 641 of the tuning component 640 is connected to the feeding point 630, a second pin 642 of the tuning component 640 is connected to a first pin 651 of the tuning component 650, and a second pin 652 of the tuning component 650 is connected to one end of the first antenna radiator 620. A reactance element 645 is connected in series between the third pin 643 of the tuning component 640 and the ground point, and a reactance element 646 is connected in series between the fourth pin 644 of the tuning component 640 and the ground point. A reactance element 655 is connected in series between the third pin 653 of the tuning component 650 and the ground point, and a reactance element 656 is connected in series between the fourth pin 654 of the tuning component 650 and the ground point.

Both the tuning component 640 and the switch assembly inside the tuning component 650 may switch a state of a circuit connected between the feeding point 630 and the first antenna radiator 620. For example, the switch assembly inside the tuning component 640 may perform switching such that the first pin 641 is grounded by using a connection path between the first pin 641 and the third pin 643, while a connection path between the first pin 541 and the fourth pin 644 of the tuning component 640 is disconnected. In this case, the reactance element 645 plays a tuning role. The switch assembly inside the tuning component 650 may perform switching such that the first pin 651 is grounded by using a connection path between the first pin 651 and the third pin 653, while a connection path between the first pin 651 and the fourth pin 654 of the tuning component 650 is disconnected. In this case, the reactance element 655 plays a tuning role.

The reactance element of the tuning component 640 may implement 8 different capacitance values, and the switch assembly of the tuning component 640 may implement at least 3 states, such that the tuning component 640 may implement at least 24 circuit states. Similarly, the reactance element of the tuning component 650 may implement 8 different capacitance values, and the switch assembly of the tuning component 650 may implement at least 3 states, such that the tuning component 650 may implement at least 24 circuit states. In this case, the tuning circuit may implement at least 24×24 circuit states. More circuit states can implement more frequency bands.

Embodiment 5

Figure 7:
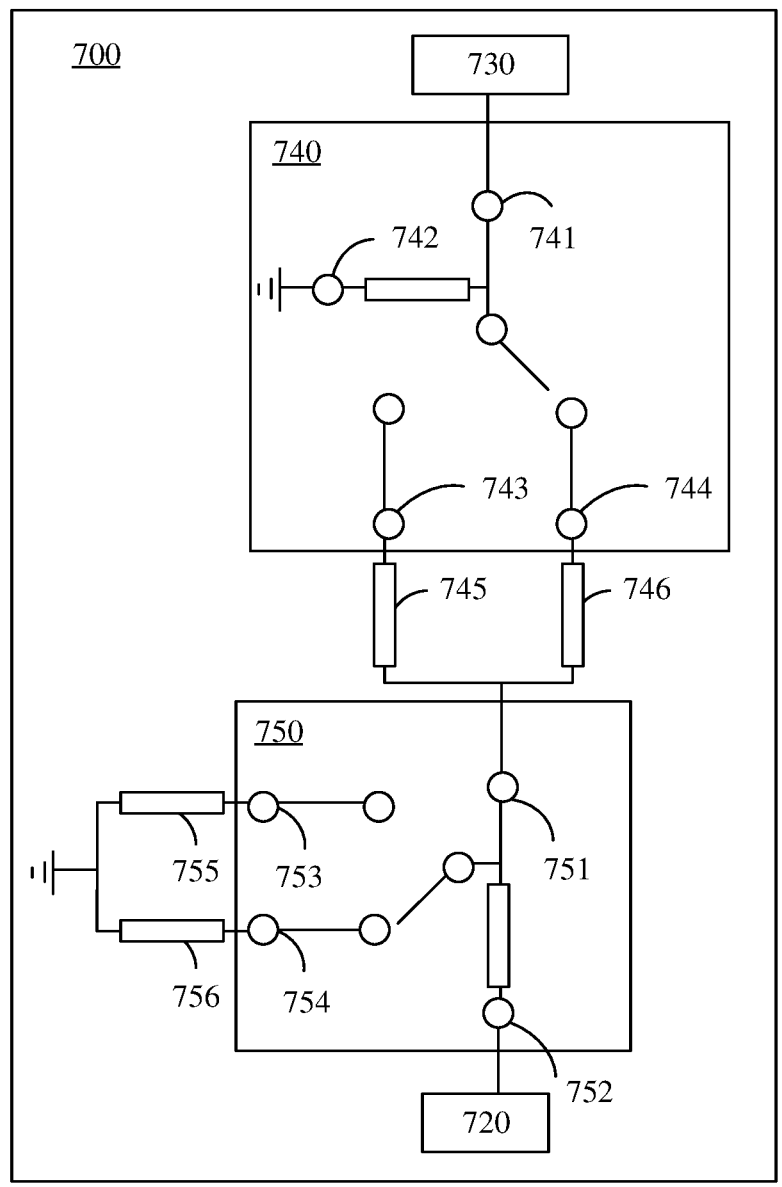
FIG. 7 is an internal circuit diagram of an antenna apparatus according to an embodiment of this application.

As shown in FIG. 7, the antenna apparatus 700 includes a package substrate, where a first antenna radiator 720, a feeding point 730, and a tuning circuit are disposed. The tuning circuit is configured to be connected between the first antenna radiator 720 and the feeding point 730.

The tuning circuit includes a tuning component 740 and a tuning component 750 shown in FIG. 1, where a first pin 741 of the tuning component 740 is connected to the feeding point 730, a third pin 743 and a fourth pin 744 of the tuning component 740 are connected to a first pin 751 of the tuning component 750, and a second pin 752 of the tuning component 750 is connected to one end of the first antenna radiator 720. A reactance element 745 is connected in series between the third pin 743 of the tuning component 740 and the first pin 751 of the tuning component 750, and a reactance element 746 is connected in series between the fourth pin 744 of the tuning component 740 and the first pin 751 of the tuning component 750. A reactance element 755 is connected in series between the third pin 753 of the tuning component 750 and the ground point, and a reactance element 756 is connected in series between the fourth pin 754 of the tuning component 750 and the ground point.

Both the tuning component 740 and the switch assembly inside the tuning component 750 may switch a state of a circuit connected between the feeding point 730 and the first antenna radiator 720. For example, the switch assembly inside the tuning component 740 may perform switching such that the feeding point 730 is connect to one end of the first antenna radiator 720 by using a connection path between the first pin 741 and the fourth pin 744 of the tuning component 740, while a connection path between the first pin 741 and the third pin 743 of the tuning component 740 is disconnected. In this case, the reactance element 746 plays a tuning role. The switch assembly inside the tuning component 750 may perform switching such that the first pin 751 is grounded by using a connection path between the first pin 751 and the third pin 753, while a connection path between the first pin 651 and the fourth pin 754 of the tuning component 750 is disconnected. In this case, the reactance element 755 plays a tuning role.

The second pin 742 of the tuning component 740 may be grounded. The second pin 742 of the tuning component 740 may be further connected to the first pin 741, the third pin 743, and the fourth pin 744 of the tuning component 740. FIG. 7 shows a schematic diagram in which the second pin 742 of the tuning component 740 is grounded.

The reactance element of the tuning component 740 may implement 8 different capacitance values, and the switch assembly of the tuning component 740 may implement at least 3 states, such that the tuning component 740 may implement at least 24 circuit states. Similarly, the reactance element of the tuning component 750 may implement 8 different capacitance values, and the switch assembly of the tuning component 750 may implement at least 3 states, such that the tuning component 750 may implement at least 24 circuit states. In this case, the tuning circuit may implement at least 24×24 circuit states. More circuit states can implement more frequency bands.

Embodiment 6

Figure 8:
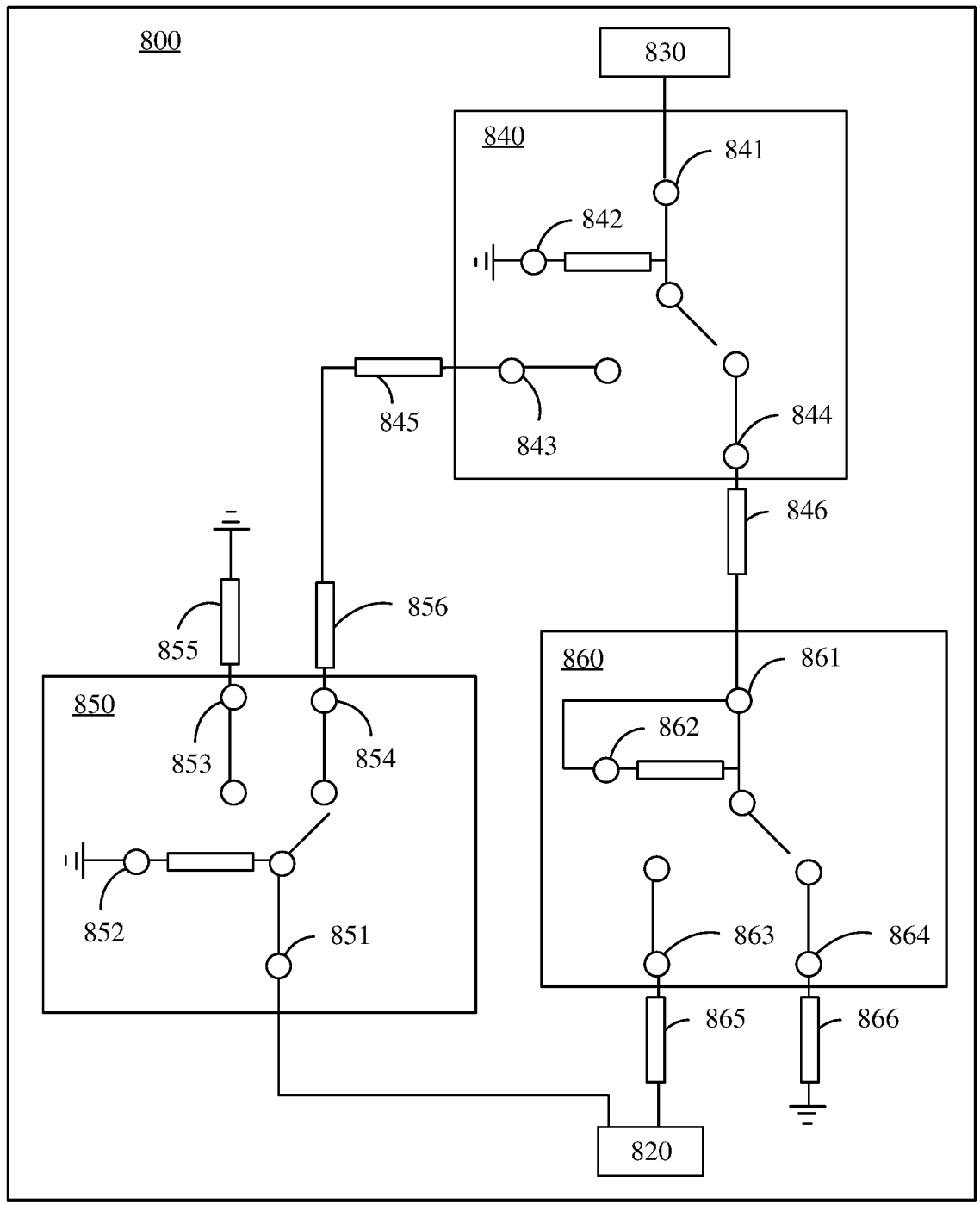
FIG. 8 is an internal circuit diagram of an antenna apparatus according to an embodiment of this application.

As shown in FIG. 8, the antenna apparatus 800 includes a package substrate, where a ring antenna radiator 820, a feeding point 830, and a tuning circuit are disposed. The tuning circuit is configured to be connected between the ring antenna radiator 820 and the feeding point 830.

The tuning circuit includes a tuning component 840, a tuning component 850, and a tuning component 860 that are shown in FIG. 1. A first pin 841 of the tuning component 840 is connected to the feeding point 830, a third pin 843 of the tuning component 840 is connected to a fourth pin 854 of the tuning component 850, and a fourth pin 844 of the tuning component 840 is connected to a first pin 861 of the tuning component 860. A first pin 851 of the tuning component 850 is connected to one end of the ring antenna radiator 820. A third pin 863 of the tuning component 860 is connected to the other end of the ring antenna radiator 820. A third pin 853 of the tuning component 850 may be grounded. A fourth pin 864 of the tuning component 860 may be grounded.

A reactance element 845 and a reactance element 856 are connected in series between the third pin 843 of the tuning component 840 and the fourth pin 854 of the tuning component 850. A reactance element 846 is connected in series between the fourth pin 844 of the tuning component 840 and the first pin 861 of the tuning component 860. A reactance element 855 is connected in series between the third pin 853 of the tuning component 850 and the ground point. A reactance element 866 is connected in series between the fourth pin 864 of the tuning component 860 and the ground point. A reactance element 865 is connected in series between the third pin 863 of the tuning component 860 and the first antenna radiator.

Switch assemblies inside the tuning component 840, the tuning component 850, and the tuning component 860 may all switch a state of a circuit connected between the feeding point 830 and the ring antenna radiator 820. For example, the switch assemblies inside the tuning component 840 and the tuning component 860 may perform switching such that the feeding point 830 is connected to one end of the ring antenna radiator 820 by using a connection path between the first pin 841 and the fourth pin 844 of the tuning component 840, and a connection path between the first pin 861 and the third pin 863 of the tuning component 860. The switch assembly inside the tuning component 850 may perform switching such that the ring antenna radiator 820 is grounded by using a connection path between the first pin 851 and the third pin 853 of the tuning component 850. In this case, the reactance element 846, the reactance element 855, and the reactance element 865 play a tuning role.

The second pin 842 of the tuning component 840 may be grounded. The second pin 842 of the tuning component 840 may be further connected to the first pin 841, the third pin 843, and the fourth pin 844 of the tuning component 840. FIG. 8 shows a schematic diagram in which the second pin 842 of the tuning component 840 is grounded.

Similarly, a second pin 852 of the tuning component 850 may be grounded. The second pin 852 of the tuning component 850 may be further connected to the first pin 851, the third pin 853, and the fourth pin 854 of the tuning component 850. FIG. 8 shows a schematic diagram in which the second pin 852 of the tuning component 850 is grounded.

Similarly, a second pin 862 of the tuning component 860 may be grounded. The second pin 862 of the tuning component 860 may be further connected to the first pin 861, the third pin 863, and the fourth pin 864 of the tuning component 860. FIG. 8 is a schematic diagram in which the second pin 862 of the tuning component 860 is connected to the first pin 861 of the tuning component 860.

Embodiment 7

Figure 9:
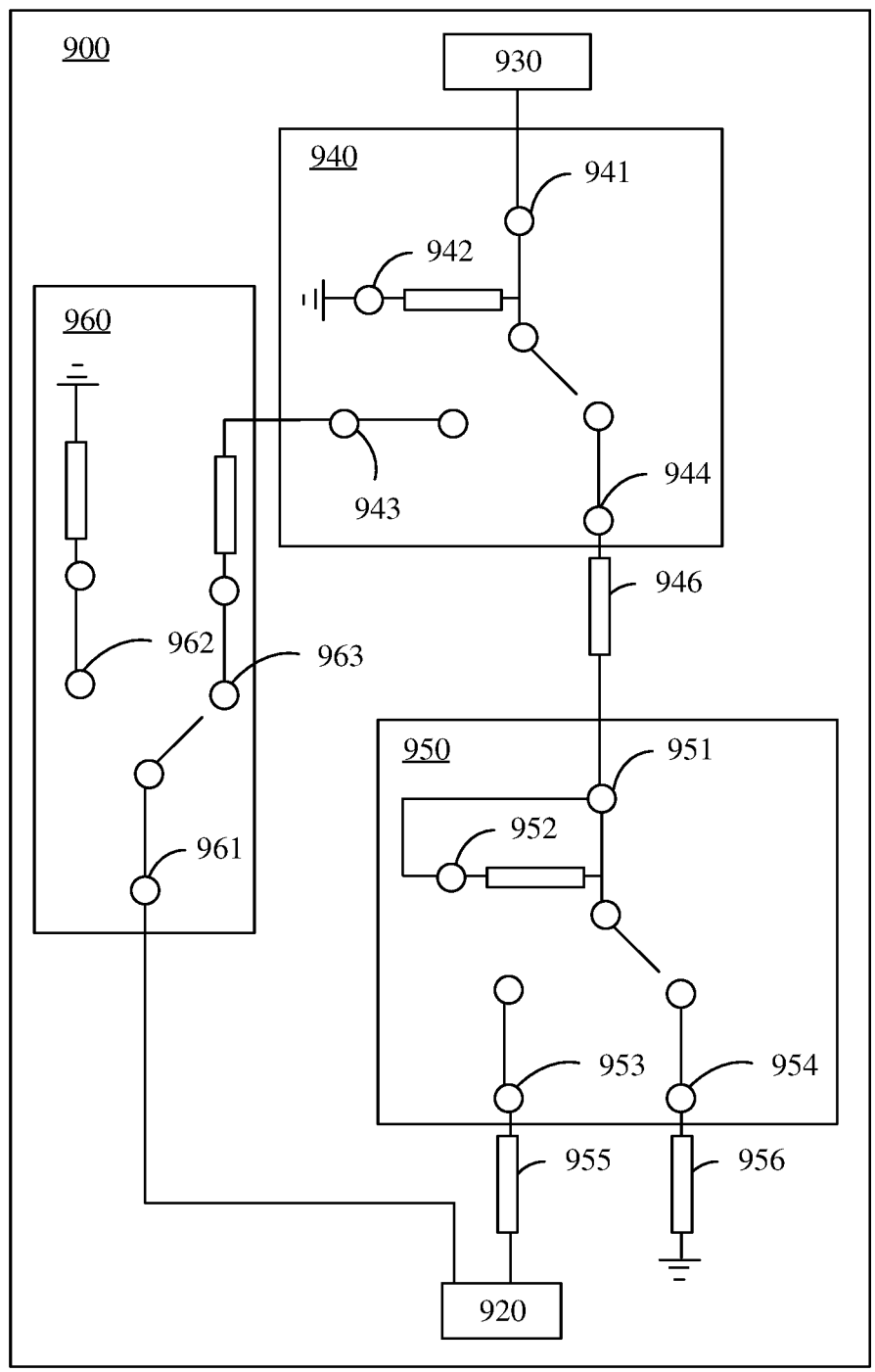
FIG. 9 is an internal circuit diagram of an antenna apparatus according to an embodiment of this application.

As shown in FIG. 9, the antenna apparatus 900 includes a package substrate, where a ring antenna radiator 920, a feeding point 930, and a tuning circuit are disposed. The tuning circuit is configured to be connected between the ring antenna radiator 920 and the feeding point 930.

The tuning circuit includes a tuning component 940, a tuning component 950, and a single-pole double-throw switch assembly tuning component 960 that are described in FIG. 1. A first pin 941 of the tuning component 940 is connected to the feeding point 930, a third pin 943 of the tuning component 940 is connected to a second movable end 963 of the single-pole double-throw switch assembly tuning component 960, and a fourth pin 944 of the tuning component 940 is connected to a first pin 951 of the tuning component 950. A fixed end 961 of the single-pole double-throw switch assembly tuning component 960 is connected to one end of the ring antenna radiator 920. A third pin 953 of the tuning component 950 is connected to the other end of the ring antenna radiator 920. A first movable end 962 of the single-pole double-throw switch assembly tuning component 960 may be grounded. A fourth pin 954 of the tuning component 950 may be grounded.

A reactance element is connected in series between the third pin 943 of the tuning component 940 and the second movable end 963 of the single-pole double-throw switch assembly tuning component 960. A reactance element 946 is connected in series between the fourth pin 944 of the tuning component 940 and the first pin 951 of the tuning component 950. A reactance element is connected in series between the first movable end 962 of the single-pole double-throw switch assembly tuning component 960 and the ground point. A reactance element 956 is connected in series between the fourth pin 954 of the tuning component 950 and the ground point. A reactance element 955 is connected in series between the third pin 953 of the tuning component 950 and the first antenna radiator.

Switch assemblies inside the tuning component 940, the single-pole double-throw switch assembly tuning component 960, and the tuning component 950 may all switch a state of a circuit connected between the feeding point 930 and the ring antenna radiator 920. For example, the switch assemblies inside the tuning component 940 and the tuning component 950 may perform switching such that the feeding point 930 is connected to one end of the ring antenna radiator 920 by using a connection path between the first pin 941 and the fourth pin 944 of the tuning component 940, and a connection path between the first pin 951 and the third pin 953 of the tuning component 950. The switch assembly inside the tuning component 960 may perform switching such that the ring antenna radiator 920 is grounded by using a connection path between the fixed end 961 and the first movable end 962 of the single-pole double-throw switch assembly tuning component 960. In this case, the reactance element 946, and the reactance element 955 may play a tuning role.

The second pin 942 of the tuning component 940 may be grounded. The second pin 942 of the tuning component 940 may be further connected to the first pin 941, the first movable end 942, and the fourth pin 944 of the tuning component 940. FIG. 9 shows a schematic diagram in which the second pin 942 of the tuning component 940 is grounded.

Similarly, a second pin 952 of the tuning component 950 may be grounded. The second pin 952 of the tuning component 950 may be further connected to the first pin 951, the third pin 953, and the fourth pin 954 of the tuning component 950. FIG. 9 is a schematic diagram in which the second pin 952 of the tuning component 950 is connected to the first pin 951 of the tuning component 950.

Figure 10:
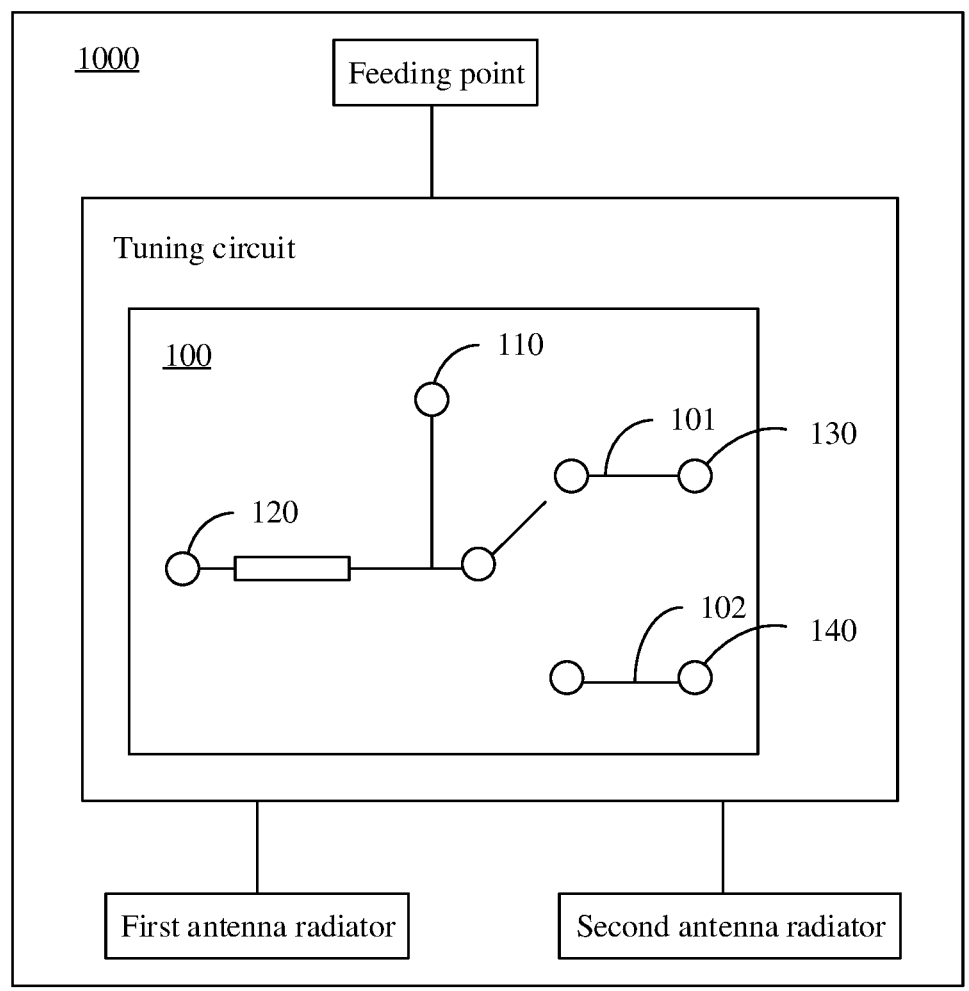
FIG. 10 is a schematic structural diagram of an antenna apparatus according to an embodiment of this application.

FIG. 10 is a schematic structural diagram of an antenna apparatus according to an embodiment of this application. The antenna apparatus 1000 includes a first antenna radiator, a second antenna radiator, a feeding point, and a tuning circuit, where the tuning circuit is configured to be connected between the first antenna radiator and the feeding point, and is configured to be connected between the second antenna radiator and the feeding point. The tuning circuit further includes a first end, a second end, and a third end. A first end of the tuning circuit is connected to the feeding point, a second end of the tuning circuit is connected to one end of the first antenna radiator, and a third end of the tuning circuit is connected to one end of the second antenna radiator. The tuning circuit includes N tuning components 100 shown in FIG. 1 connected between the first antenna radiator and the feeding point. The tuning circuit includes M tuning components 100 shown in FIG. 1 connected between the second antenna radiator and the feeding point. At least two of the first pin 110, the second pin 120, the third pin 130, and the fourth pin 140 of each of the N tuning components 100 are connected between the first antenna radiator and the feeding point. At least two of the first pin 110, the second pin 120, the third pin 130, and the fourth pin 140 of each of the M tuning components 100 are connected between the second antenna radiator and the feeding point, where both N and M are positive integers greater than or equal to 1.

I. First Antenna Radiator

The first antenna radiator is configured to receive a signal, or is configured to receive or send a signal.

J. Second Antenna Radiator

The first antenna radiator is configured to receive a signal, or is configured to receive or send a signal. An operating frequency band of the second antenna radiator is the same as or different from that of the first antenna radiator.

K. Feeding Point

The feeding point is configured to provide a feed source for the first antenna radiator.

L. Tuning Component

The tuning component takes a possible form of the tuning component 100 shown in FIG. 1. The antenna apparatus 1000 includes one or more tuning components.

In other words, a tuning circuit including the tuning component shown in FIG. 1 is connected to a plurality of antenna radiators, and each tuning component 100 is connected to the tuning circuit by using at least two of a first pin 110, a second pin 120, a third pin 130, and a fourth pin 140 of the tuning component 100.

In an example, the tuning circuit includes M+N tuning components 100, where the N tuning components 100 are connected between the first antenna radiator and the feeding point, and the M tuning components 100 are connected between the second antenna radiator and the feeding point.

Optionally, the M tuning components 100 include a second tuning component, and the second tuning component is connected between a first end of the tuning circuit and a second end of the tuning circuit.

That is, the antenna apparatus 1000 includes a second tuning component. The second tuning component is not only connected between the first antenna radiator and the feeding point, but also connected between the second antenna radiator and the feeding point.

Optionally, the tuning components include a third tuning component. A third pin of the third tuning component is connected to the second end of the tuning circuit, and a fourth pin of the third tuning component is connected to the third end of the tuning circuit.

That is, a first internal branch 101 inside the third tuning component is configured to connect one end of the first antenna radiator to the feeding point. A second internal branch 102 inside the third tuning component is configured to connect one end of the second antenna radiator to the feeding point.

Optionally, the N tuning components 100 include a first tuning component, and a second pin of the first tuning component is connected to a first pin, a third pin, or a fourth pin of the first tuning component; or a second pin of the first tuning component is connected to the first end of the tuning circuit or the second end of the tuning circuit.

In other words, two ends of a reactance element inside the first tuning component in the N tuning components 100 are connected.

Optionally, the M tuning components 100 include a first tuning component, and a second pin of the first tuning component is connected to a first pin, a third pin, or a fourth pin of the first tuning component; or a second pin of the first tuning component is connected to the first end of the tuning circuit or the second end of the tuning circuit.

In other words, two ends of a reactance element inside the first tuning component in the M tuning components 100 are connected.

Optionally, the antenna apparatus 1000 further includes a ground point. The N tuning components 100 include a fourth tuning component, and at least one of a first pin, a second pin, a third pin, and a fourth pin of the fourth tuning component is connected to the ground point.

In other words, the N tuning components 100 include a fourth tuning component, a pin of which is grounded, and the grounded pin may be one or more of a first pin, a second pin, a third pin, and a fourth pin of the fourth tuning component.

Optionally, the antenna apparatus 1000 further includes a ground point. The M tuning components 100 include a fourth tuning component, and at least one of a first pin, a second pin, a third pin, and a fourth pin of the fourth tuning component is connected to the ground point.

In other words, the M tuning components 100 include a fourth tuning component, a pin of which is grounded, and the grounded pin may be one or more of a first pin, a second pin, a third pin, and a fourth pin of the fourth tuning component.

Embodiment 8

Figure 11:
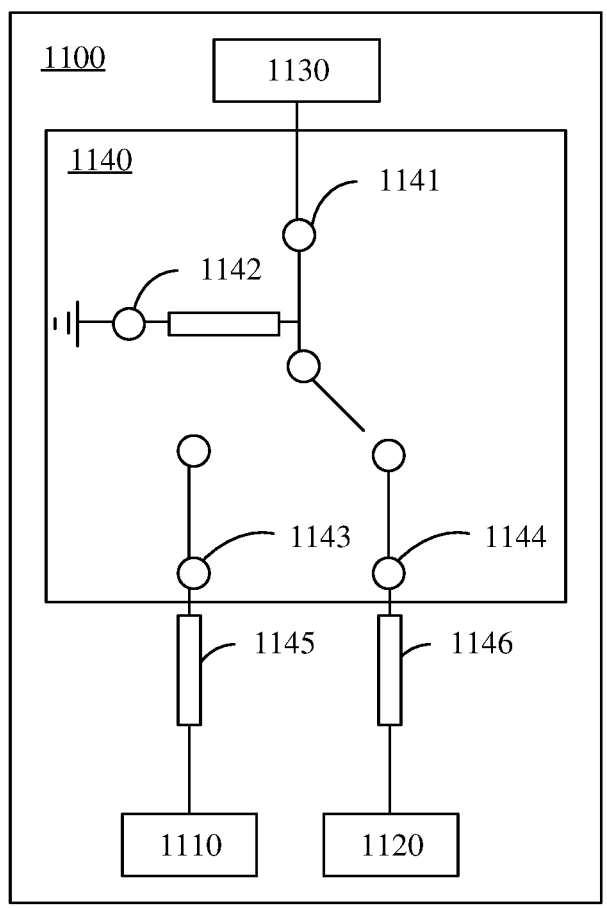
FIG. 11 is an internal circuit diagram of an antenna apparatus according to an embodiment of this application.

As shown in FIG. 11, the antenna apparatus 1100 includes a first antenna radiator 1110, a second antenna radiator 1120, a feeding point 1130, and a tuning circuit. The tuning circuit is configured to be connected between the first antenna radiator 1110 and the feeding point 1130, and the tuning circuit is configured to be connected between the second antenna radiator 1120 and the feeding point 1130.

The tuning circuit includes a tuning component 1140 shown in FIG. 1. A first pin 1141 of the tuning component 1140 is connected to the feeding point 1130, a third pin 1143 of the tuning component 1140 is connected to one end of the first antenna radiator 1110, and a fourth pin 1144 of the tuning component 1140 is connected to one end of the second antenna radiator 1120.

A reactance element 1145 is connected in series between the third pin 1143 and the first antenna radiator 1110, and a reactance element 1146 is connected in series between the fourth pin 1144 and the second antenna radiator 1120.

The switch assembly inside the tuning component 1140 may switch a circuit that connects the feeding point 1130 and the first antenna radiator 1110, and/or switch a circuit that connects the feeding point 1130 and the second antenna radiator 1120. For example, the switch assembly may perform switching such that the feeding point 1130 is connected to one end of the first antenna radiator 1110 by using a connection path between the first pin 1141 and the third pin 1143, while a connection path between the first pin 1141 and the fourth pin 1144 is disconnected. In this case, the tuning circuit plays a tuning role between the feeding point 1130 and the first antenna radiator 1110. The switch assembly may further perform switching such that the feeding point 1130 is connected to one end of the second antenna radiator 1120 by using a connection path between the first pin 1141 and the fourth pin 1144, while a connection path between the first pin 1141 and the third pin 1143 is disconnected. In this case, the tuning circuit plays a tuning role between the feeding point 1130 and the second antenna radiator 1120. The switch assembly may further perform switching such that the feeding point 1130 is connected to one end of the first antenna radiator 1110 by using a connection path between the first pin 1141 and the third pin 1143, and the feeding point 1130 is connected to one end of the second antenna radiator 1120 by using a connection path between the first pin 1141 and the fourth pin 1144. In this case, the tuning circuit plays a tuning function between the feeding point 1130 and the first antenna radiator 1110, and between the feeding point 1130 and the second antenna radiator 1120.

The second pin 1142 of the tuning component 1140 may be grounded. The second pin 1142 of the tuning component 1140 may be further connected to the first pin 1141, the third pin 1143, and the fourth pin 1144 of the tuning component 1140. FIG. 11 shows a schematic diagram in which the second pin 1142 of the tuning component 1140 is grounded.

Embodiment 9

Figure 12:
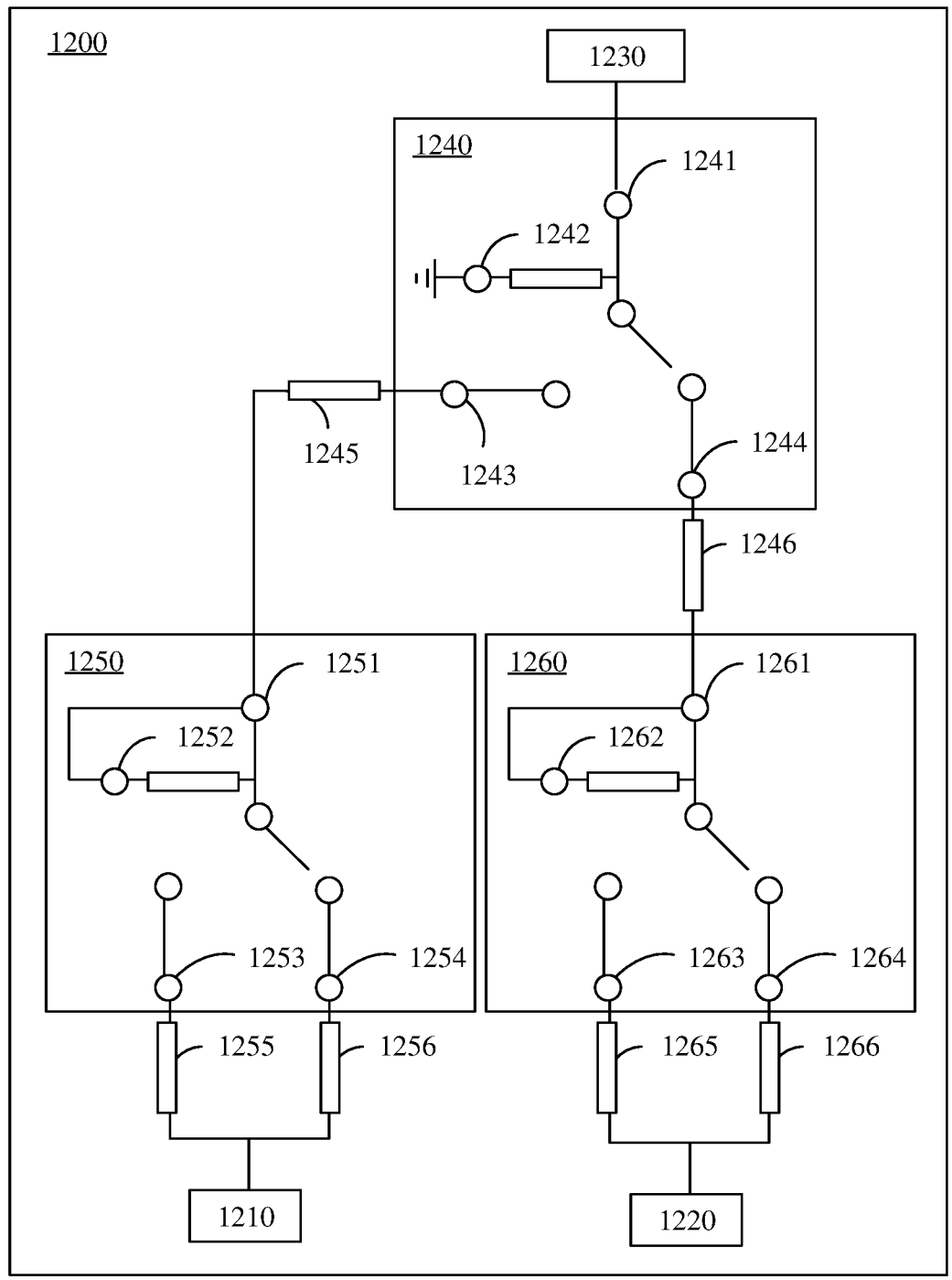
FIG. 12 is an internal circuit diagram of an antenna apparatus according to an embodiment of this application.

As shown in FIG. 12, the antenna apparatus 1200 includes a package substrate, where a first antenna radiator 1110, a second antenna radiator 1220, a feeding point 1230, and a tuning circuit are disposed. The tuning circuit is configured to be connected between the first antenna radiator 1210 and the feeding point 1230, and the tuning circuit is configured to be connected between the second antenna radiator 1220 and the feeding point 1230.

The tuning circuit includes a tuning component 1240, a tuning component 1250, and a tuning component 1260 that are shown in FIG. 1. A first pin 1241 of the tuning component 1240 is connected to the feeding point 1230, a third pin 1243 of the tuning component 1240 is connected to a first pin 1251 of the tuning component 1250, and a fourth pin 1244 of the tuning component 1240 is connected to a first pin 1261 of the tuning component 1260. A third pin 1253 and a fourth pin 1254 of the tuning component 1250 are connected to one end of the first antenna radiator 1210. A third pin 1263 and a fourth pin 1264 of the tuning component 1260 are connected to one end of the second antenna radiator 1220.

The third pin 1243 and the fourth pin 1254 of the tuning component 1240 may be externally connected to a reactance element. As shown in FIG. 12, the third pin 1243 of the tuning component 1240 is externally connected to a reactance element 1245, and the fourth pin 1244 of the tuning component 1240 is externally connected to a reactance element 1246. Similarly, the third pin 1253 and the fourth pin 1254 of the tuning component 1250 may be externally connected to a reactance element. As shown in FIG. 12, the third pin 1253 of the tuning component 1250 is externally connected to a reactance element 1255, and the fourth pin 1254 of the tuning component 1250 is externally connected to a reactance element 1256. Similarly, the third pin 1263 and the fourth pin 1254 of the tuning component 1260 may be externally connected to a reactance element. As shown in FIG. 12, the third pin 1263 of the tuning component 1260 is externally connected to a reactance element 1265, and the fourth pin 1264 of the tuning component 1260 is externally connected to a reactance element 1266.

The switch assembly inside the tuning component 1240 may switch a circuit that connects the feeding point 1230 and the first antenna radiator 1210, and/or switch a circuit that connects the feeding point 1230 and the second antenna radiator 1220. For example, the switch assembly may perform switching such that the feeding point 1230 is connected to one end of the first antenna radiator 1210 by using a connection path between the first pin 1241 and the third pin 1243, while a connection path between the first pin 1241 and the fourth pin 1244 is disconnected. In this case, the tuning circuit plays a tuning role between the feeding point 1230 and the first antenna radiator 1210. The switch assembly may further perform switching such that the feeding point 1230 is connected to one end of the second antenna radiator 1220 by using a connection path between the first pin 1241 and the fourth pin 1244, while a connection path between the first pin 1241 and the third pin 1243 is disconnected. In this case, the tuning circuit plays a tuning role between the feeding point 1230 and the second antenna radiator 1220. The switch assembly may further perform switching such that the feeding point 1230 is connected to one end of the first antenna radiator 1210 by using a connection path between the first pin 1241 and the third pin 1243, and the feeding point 1230 is connected to one end of the second antenna radiator 1220 by using a connection path between the first pin 1241 and the fourth pin 1244. In this case, the tuning circuit plays a tuning function between the feeding point 1230 and the first antenna radiator 1210, and between the feeding point 1230 and the second antenna radiator 1220.

The switch assembly inside the tuning component 1250 may switch a circuit state of a connection path between the feeding point 1230 and the first antenna radiator 1210. For example, the switch assembly inside the tuning component 1250 may perform switching such that the feeding point 830 is connected to one end of the first antenna radiator 1210 by using a connection path between the first pin 1251 and the third pin 1253 of the tuning component 1250. The switch assembly inside the tuning component 1250 may perform switching such that the feeding point 830 is connected to one end of the first antenna radiator 1210 by using a connection path between the first pin 1251 and the fourth pin 1254 of the tuning component 1250.

The switch assembly inside the tuning component 1260 may switch a circuit state of a connection path between the feeding point 1230 and the second antenna radiator 1220. For example, the switch assembly inside the tuning component 1260 may perform switching such that the feeding point 830 is connected to one end of the second antenna radiator 1220 by using a connection path between the first pin 1261 and the third pin 1263 of the tuning component 1260. The switch assembly inside the tuning component 1260 may perform switching such that the feeding point 830 is connected to the second antenna radiator 1220 by using a connection path between the first pin 1261 and the fourth pin 1264 of the tuning component 1260.

The second pin 1242 of the tuning component 1240 may be grounded. The second pin 1242 of the tuning component 1240 may be further connected to the first pin 1241, the third pin 1243, and the fourth pin 1244 of the tuning component 1240. FIG. 12 shows a schematic diagram in which the second pin 1242 of the tuning component 1240 is grounded.

Similarly, a second pin 1252 of the tuning component 1250 may be grounded. The second pin 1252 of the tuning component 1250 may be further connected to the first pin 1251, the third pin 1253, and the fourth pin 1254 of the tuning component 1250. FIG. 12 is a schematic diagram in which the second pin 1252 of the tuning component 1250 is connected to the first pin 1251 of the tuning component 1250.

Similarly, a second pin 1262 of the tuning component 1260 may be grounded. The second pin 1262 of the tuning component 1260 may be further connected to the first pin 1261, the third pin 1263, and the fourth pin 1264 of the tuning component 1260. FIG. 12 is a schematic diagram in which the second pin 1262 of the tuning component 1260 is connected to the first pin 1261 of the tuning component 1260.

Figure 13:
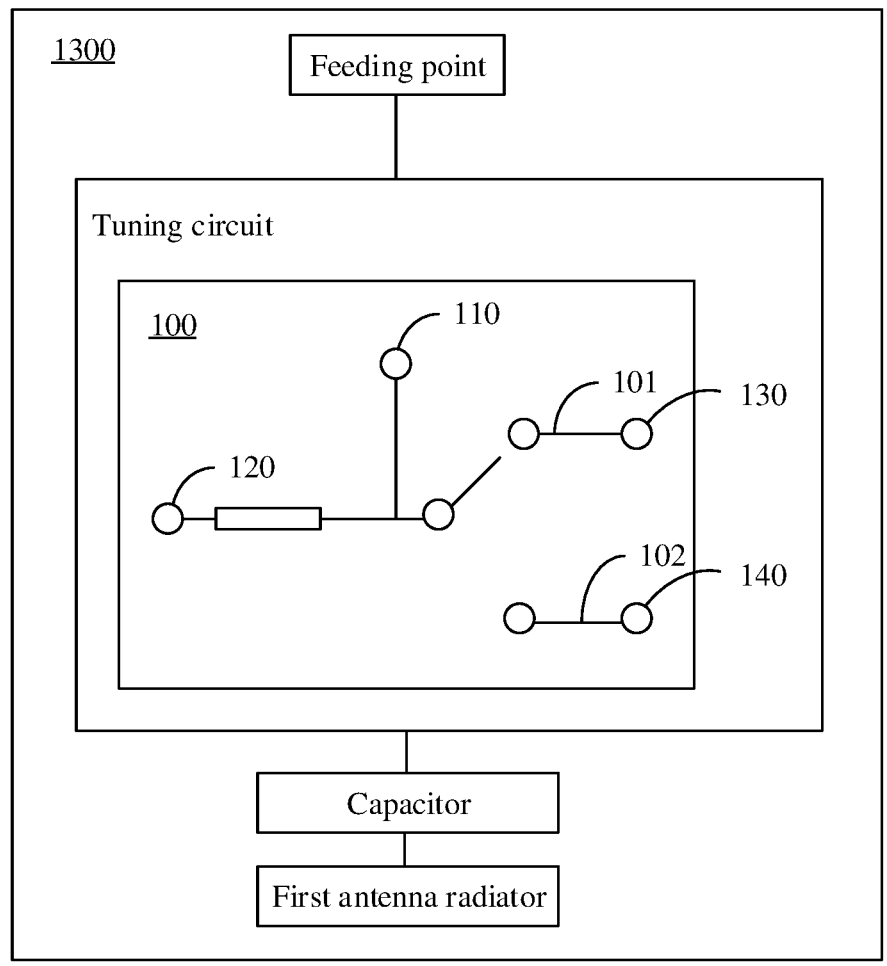
FIG. 13 is a schematic structural diagram of an antenna apparatus according to an embodiment of this application.

FIG. 13 is a schematic structural diagram of an antenna apparatus according to an embodiment of this application. The antenna apparatus 1300 includes a composite right/left handed+inverted-F antenna radiator, a feeding point, and a tuning circuit, where a first end of the tuning circuit is configured to be connected to the feeding point, and a second end of the tuning circuit is configured to be connected to the composite right/left handed+inverted-F antenna radiator. An external capacitor is connected in series between the second end of the tuning circuit and the composite right/left handed+inverted-F antenna radiator. The tuning circuit includes N tuning components 100 shown in FIG. 1. At least two of the first pin 110, the second pin 120, the third pin 130, and the fourth pin 140 of each of the N tuning components 100 are configured to be connected between the first antenna radiator and the feeding point, where N is a positive integer greater than or equal to 1.

I. Composite Right/Left Handed+Inverted-F Antenna Radiator

The composite right/left handed+inverted-F antenna (composite right/left hand+inverted-F antenna, CRLH+IFA) radiator is configured to receive, or is configured to receive or send a signal.

J. External Capacitor

As a capacitive exciter, the external capacitor plays a role in exciting the antenna, and reduces a resonance size of the antenna when a resonance wavelength of the antenna remains unchanged.

K. Feeding Point

The feeding point is configured to provide a feed source for the first antenna radiator.

L. Tuning Component

Pins connecting the first antenna radiator and the feeding point may be any at least two of the first pin 110, the second pin 120, the third pin 130, and the fourth pin 140. Each tuning component 100 is connected to the tuning circuit by using at least two of the first pin 110, the second pin 120, the third pin 130, and the fourth pin 140 of the tuning component 100.

Embodiment 10

Figure 14:
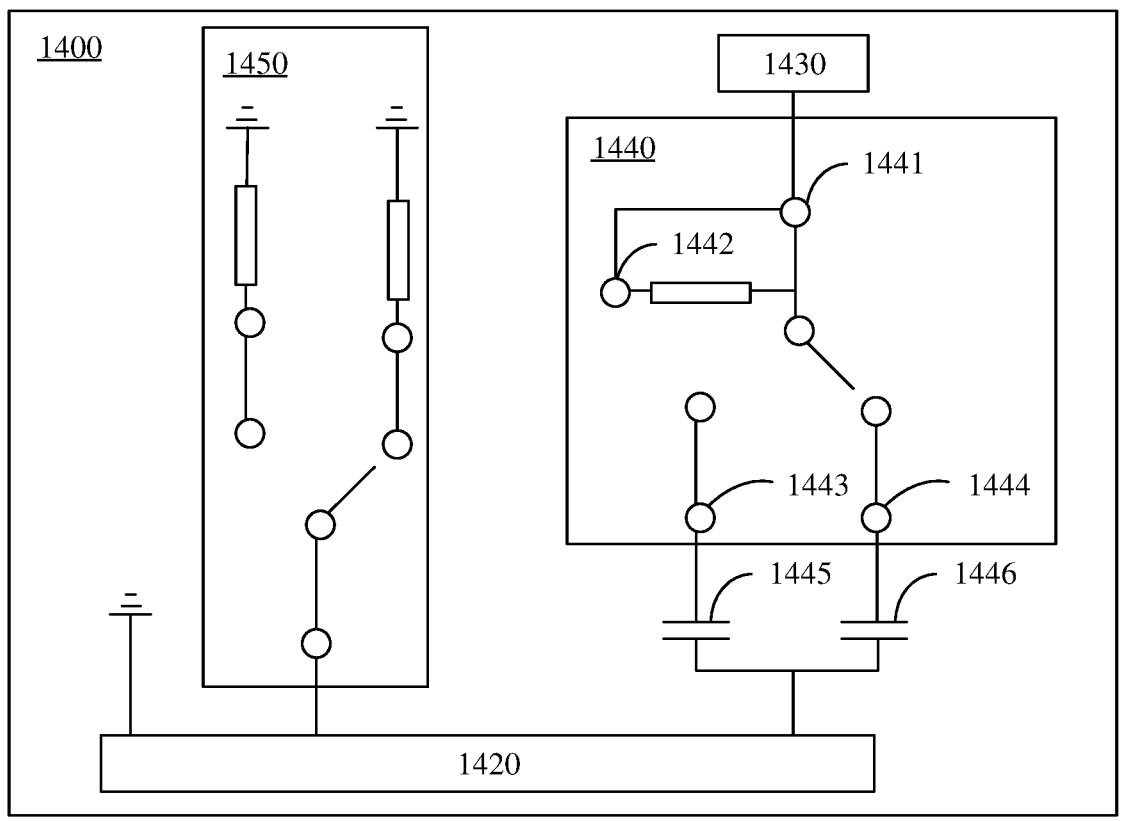
FIG. 14 is an internal circuit diagram of an antenna apparatus according to an embodiment of this application.

As shown in FIG. 14, the antenna apparatus 1400 includes a package substrate, where a composite right/left handed+inverted-F antenna radiator 1420, a feeding point 1430, a tuning circuit, and a single-pole multi-throw switch tuning component 1450 are disposed. A first end of the composite right/left handed+inverted-F antenna radiator 1420 is grounded, a second end is grounded by using a single-pole multi-throw switch tuning component 1450, and a third end is connected to the feeding point 1430 by using the tuning circuit.

The tuning circuit includes one tuning component 1440 shown in FIG. 1. A first pin 1441 of the tuning component 1440 is connected to the feeding point 1430, and a third pin 1443 and a fourth pin 1444 of the tuning component 1440 are connected to the third end of the composite right/left handed+inverted-F antenna radiator 1420. A capacitor element 1445 is connected in series between the third pin 1443 and the composite right/left handed+inverted-F antenna radiator 1420, and a capacitor element 1446 is connected in series between the fourth pin 1444 and the composite right/left handed+inverted-F antenna radiator 1420.

The switch assembly inside the tuning component 1440 may switch a state of a circuit that connects the feeding point 1430 and the composite right/left handed+inverted-F antenna radiator 1420. For example, the switch assembly may perform switching such that the feeding point 1430 is connected to the third end of the composite right/left handed+inverted-F antenna radiator 1420 by using a connection path between the first pin 1441 and the third pin 1443, while a connection path between the first pin 1441 and the fourth pin 1444 is disconnected. In this case, the capacitor element 1445 plays a tuning role. The switch assembly may further perform switching such that the feeding point 1430 is connected to the third end of the composite right/left handed+inverted-F antenna radiator 1420 by using a connection path between the first pin 1441 and the fourth pin 1444, while a connection path between the first pin 1441 and the third pin 1443 is disconnected. In this case, the capacitor element 1446 plays a tuning role. The switch assembly may further perform switching such that the feeding point 1430 is connected to the third end of the composite right/left handed+inverted-F antenna radiator 1420 by using a connection path between the first pin 1441 and the third pin 1443, and the feeding point 1430 is connected to the third end of the composite right/left handed+inverted-F antenna radiator 1420 by using a connection path between the first pin 1441 and the fourth pin 1444. In this case, both the capacitor element 1445 and the capacitor element 1446 play a tuning role.

The second pin 1442 of the tuning component 1440 may be grounded. The second pin 1442 of the tuning component 1440 may be further connected to the first pin 1441, the third pin 1443, and the fourth pin 1444 of the tuning component 1440. FIG. 14 is a schematic diagram in which the second pin 1442 of the tuning component 1440 is connected to the first pin 1441 of the tuning component 1440.

Embodiment 11

Figure 15:
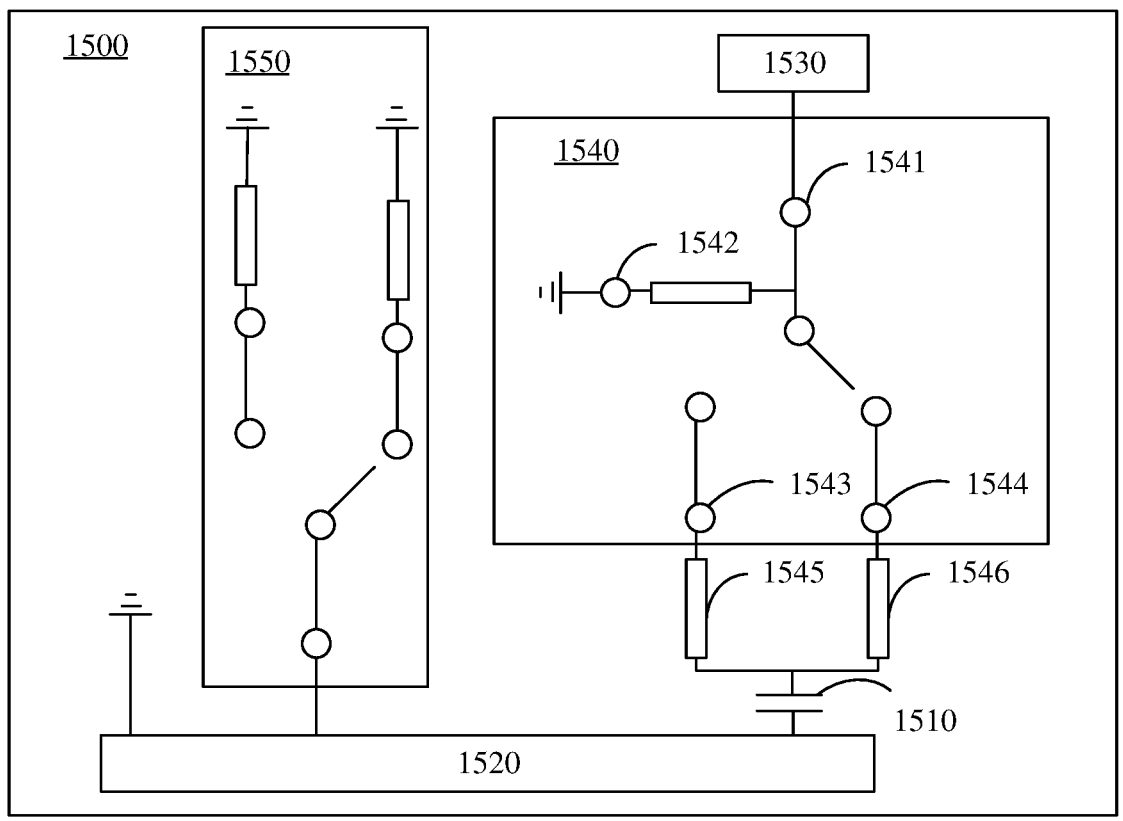
FIG. 15 is an internal circuit diagram of an antenna apparatus according to an embodiment of this application.

As shown in FIG. 15, the antenna apparatus 1500 includes a package substrate, where a capacitor 1510, a composite right/left handed+inverted-F antenna radiator 1520, a feeding point 1530, a tuning circuit, and a single-pole multi-throw switch tuning component 1550 are disposed. A first end of the composite right/left handed+inverted-F antenna radiator 1520 is grounded, a second end is grounded by using a single-pole multi-throw switch tuning component 1550, and a third end is connected to the feeding point 1530 by using the tuning circuit. The capacitor 1510 is connected in series between the tuning circuit and the single-pole multi-throw switch tuning component 1550.

The tuning circuit includes one tuning component 1540 shown in FIG. 1. A first pin 1541 of the tuning component 1540 is connected to the feeding point 1530, and a third pin 1543 and a fourth pin 1544 of the tuning component 1540 are connected to the third end of the composite right/left handed+inverted-F antenna radiator 1520. A reactance element 1545 is connected in series between the third pin 1543 and the composite right/left handed+inverted-F antenna radiator 1520, and a reactance element 1546 is connected in series between the fourth pin 1544 and the composite right/left handed+inverted-F antenna radiator 1520.

The switch assembly inside the tuning component 1540 may switch a state of a circuit that connects the feeding point 1530 and the composite right/left handed+inverted-F antenna radiator 1520. For example, the switch assembly may perform switching such that the feeding point 1530 is connected to the third end of the composite right/left handed+inverted-F antenna radiator 1520 by using a connection path between the first pin 1541 and the third pin 1543, while a connection path between the first pin 1541 and the fourth pin 1544 is disconnected. In this case, the reactance element 1545 plays a tuning role. The switch assembly may further perform switching such that the feeding point 1530 is connected to the third end of the composite right/left handed+inverted-F antenna radiator 1520 by using a connection path between the first pin 1541 and the fourth pin 1544, while a connection path between the first pin 1541 and the third pin 1543 is disconnected. In this case, the reactance element 1546 plays a tuning role. The switch assembly may further perform switching such that the feeding point 1530 is connected to the third end of the composite right/left handed+inverted-F antenna radiator 1520 by using a connection path between the first pin 1541 and the third pin 1543, and the feeding point 1530 is connected to the third end of the composite right/left handed+inverted-F antenna radiator 1520 by using a connection path between the first pin 1541 and the fourth pin 1544. In this case, both the reactance element 1545 and the reactance element 1546 play a tuning role.

The second pin 1542 of the tuning component 1540 may be grounded. The second pin 1542 of the tuning component 1540 may be further connected to the first pin 1541, the third pin 1543, and the fourth pin 1544 of the tuning component 1540. FIG. 15 shows a schematic diagram in which the second pin 1542 of the tuning component 1540 is grounded.

An embodiment of this application further provides a terminal device. The terminal device includes an antenna apparatus.

Specifically, the antenna apparatus may be at least one of the antenna apparatus 200, the antenna apparatus 1000, and the antenna apparatus 1300 described above.

Optionally, the terminal device further includes a metal middle frame and a radio frequency circuit. The antenna apparatus is connected to the radio frequency circuit, and the antenna apparatus transmits a signal of the radio frequency circuit by using the metal middle frame.

It should be understood that the metal middle frame of the terminal device includes a metal frame of the terminal device.

Specifically, a feeding point of the antenna apparatus is connected to the radio frequency circuit. For example, a feeding point in at least one of the antenna apparatus 200, the antenna apparatus 1000, and the antenna apparatus 1300 may be connected to the radio frequency circuit. The antenna apparatus may transmit, by using the metal middle frame of the terminal device, a space signal that is converted from an electrical signal of the radio frequency circuit.

A person of ordinary skill in the art may be aware that units and algorithm steps in the examples described with reference to the embodiments disclosed in this specification may be implemented by electronic hardware or a combination of computer software and electronic hardware. Whether the functions are performed by hardware or software depends on particular applications and design constraints of the technical solutions. A person skilled in the art may use different methods to implement the described functions for each particular application, but it should not be considered that the implementation goes beyond the scope of this application.

It may be clearly understood by a person skilled in the art that for the purpose of convenient and brief descriptions, for a detailed working process of the foregoing system, apparatus, and unit, refer to a corresponding process in the foregoing method embodiments. Details are not described herein again.

In the several embodiments provided in this application, it should be understood that the disclosed system, apparatus, and method may be implemented in another manner. For example, the described apparatus embodiment is merely an example. For example, division into the units is merely logical function division and may be other division in an actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, and may be located in one position, or may be distributed on a plurality of network units. Some or all of the units may be selected based on actual requirements to achieve the objectives of the solutions of the embodiments.

In addition, function units in the embodiments of this application may be integrated into one processing unit, or each of the units may exist alone physically, or two or more units are integrated into one unit.

When the functions are implemented in a form of a software function unit and sold or used as an independent product, the functions may be stored in a computer readable storage medium. Based on such an understanding, the technical solutions of this application essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of this application. The foregoing storage medium includes any medium that can store program code, such as a USB flash drive, a removable hard disk, a read-only memory (read-only memory, ROM), a random access memory (random access memory, RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A tuning component, comprising:
   a plurality of pins, wherein the plurality of pins comprises a first pin, a second pin, a third pin, and a fourth pin;
   a reactance element, wherein the reactance element is connected between the first pin and the second pin;
   a switch assembly, disposed between the third pin and the fourth pin;
   a first internal branch, wherein one end of the first internal branch is connected to the third pin;
   a second internal branch, wherein one end of the second internal branch is connected to the fourth pin, and wherein the other end of the first internal branch is connected to the other end of the second internal branch to form an integrated end, and the integrated end is connected to the first pin; and
   a signal controller, wherein the signal controller is configured to control the switch assembly to switch between an on state and an off state of the first internal branch and to control the switch assembly to switch between an on state and an off state of the second internal branch, and wherein the signal controller, the switch assembly, the reactance element, and the plurality of pins are disposed on one substrate;
   wherein a first frequency band corresponds to a state of the first internal branch being the on state and a state of the second internal branch being the off state;
   wherein a second frequency band corresponds to the state of the first internal branch being the off state and the state of the second internal branch being the on state;
   wherein a third frequency band corresponds to the state of the first internal branch being the off state and the state of the second internal branch being the off state; and
   wherein a fourth frequency band corresponds to the state of the first internal branch being the on state and the state of the second internal branch being the on state.

2. The tuning component according to claim 1, wherein the reactance element is a variable capacitor; and the signal controller is further configured to switch a capacitance value of the reactance element, wherein the capacitance value of the variable capacitor ranges from 0.7 pF to 2.7 pF.

3. The tuning component according to claim 2, wherein the variable capacitor is configured to switch between at least eight different capacitance values.

4. The tuning component according to claim 2, wherein the reactance element is a variable inductor; and the signal controller is further configured to switch an inductance value of the reactance element.

5. The tuning component according to claim 1, wherein the tuning component further comprises:
   a branch reactor, wherein the branch reactor is disposed on the first internal branch or the second internal branch.

6. The tuning component according to claim 5, wherein the branch reactor is a variable capacitor; and the signal controller is further configured to switch a capacitance value of the branch reactor.

7. The tuning component according to claim 5, wherein the branch reactor is a variable inductor; and the signal controller is further configured to switch an inductance value of the branch reactor.

8. The tuning component according to claim 1, wherein the on state and the off state of the first internal branch correspond to two frequency bands, and the on state and the off state of the second internal branch correspond to two frequency bands.

9. The tuning component according to claim 1, wherein at least one of the first pin, the second pin, the third pin, or the fourth pin is connected to a ground point.

10. An electronic device, comprising:
    a tuning component, wherein the tuning component includes:
       a plurality of pins, wherein the plurality of pins comprises a first pin, a second pin, a third pin, and a fourth pin;
       a reactance element, wherein the reactance element is connected between the first pin and the second pin;
       a switch assembly, disposed between the third pin and the fourth pin;
       a first internal branch, wherein one end of the first internal branch is connected to the third pin;
       a second internal branch, wherein one end of the second internal branch is connected to the fourth pin, and wherein the other end of the first internal branch is connected to the other end of the second internal branch to form an integrated end, and the integrated end is connected to the first pin; and
       a signal controller, wherein the signal controller is configured to control the switch assembly to switch between an on state and an off state of the first internal branch and to control the switch assembly to switch between an on state and an off state of the second internal branch, and wherein the signal controller, the switch assembly, the reactance element, and the plurality of pins are disposed on one substrate;
    wherein a first frequency band corresponds to a state of the first internal branch being the on state and a state of the second internal branch being the off state;
    wherein a second frequency band corresponds to the state of the first internal branch being the off state and the state of the second internal branch being the on state;
    wherein a third frequency band corresponds to the state of the first internal branch being the off state and the state of the second internal branch being the off state; and
    wherein a fourth frequency band corresponds to the state of the first internal branch being the on state and the state of the second internal branch being the on state.

11. The electronic device according to claim 10, wherein the reactance element is a variable capacitor; and the signal controller is further configured to switch a capacitance value of the reactance element, wherein the capacitance value of the variable capacitor ranges from 0.7 pF to 2.7 pF.

12. The electronic device according to claim 11, wherein the variable capacitor is configured to switch between at least eight different capacitance values.

13. The electronic device according to claim 11, wherein the reactance element is a variable inductor; and the signal controller is further configured to switch an inductance value of the reactance element.

14. The electronic device according to claim 10, wherein the tuning component further comprises:
    a branch reactor, wherein the branch reactor is disposed on the first internal branch or the second internal branch.

15. The electronic device according to claim 14, wherein the branch reactor is a variable capacitor; and the signal controller is further configured to switch a capacitance value of the branch reactor.

16. The electronic device according to claim 14, wherein the branch reactor is a variable inductor; and the signal controller is further configured to switch an inductance value of the branch reactor.

17. The electronic device according to claim 10, wherein the on state and the off state of the first internal branch correspond to two frequency bands, and the on state and the off state of the second internal branch correspond to two frequency bands.

18. The electronic device according to claim 10, wherein at least one of the first pin, the second pin, the third pin, or the fourth pin is connected to a ground point.

* * * * *

UNITED STATES PATENT AND TRADEMARK OFFICE
CERTIFICATE OF CORRECTION

PATENT NO. : 12,143,131 B2
APPLICATION NO. : 17/431906
DATED : November 12, 2024
INVENTOR(S) : Sun et al.

Page 1 of 1

It is certified that error appears in the above-identified patent and that said Letters Patent is hereby corrected as shown below:

On the Title Page

Applicant (71): "Honor Device Co., Ltd., Guangdong (CN)" should read -- Honor Device Co., Ltd., Shenzhen (CN) --.

Signed and Sealed this
Tenth Day of December, 2024

Katherine Kelly Vidal
*Director of the United States Patent and Trademark Office*